US009679963B2

(12) United States Patent
Tschumakow et al.

(10) Patent No.: US 9,679,963 B2
(45) Date of Patent: *Jun. 13, 2017

(54) SEMICONDUCTOR STRUCTURE AND A METHOD FOR PROCESSING A CARRIER

(71) Applicant: Infineon Technologies AG, Neubiberg (DE)

(72) Inventors: Dmitri Alex Tschumakow, Dresden (DE); Erhard Landgraf, Dresden (DE); Claus Dahl, Dresden (DE); Steffen Rothenhaeusser, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/969,023

(22) Filed: Dec. 15, 2015

(65) Prior Publication Data

US 2016/0099311 A1    Apr. 7, 2016

Related U.S. Application Data

(63) Continuation of application No. 14/258,073, filed on Apr. 22, 2014, now Pat. No. 9,219,117.

(51) Int. Cl.
*H01L 29/66* (2006.01)
*H01L 29/06* (2006.01)
(Continued)

(52) U.S. Cl.
CPC .. *H01L 29/0649* (2013.01); *H01L 21/823481* (2013.01); *H01L 27/088* (2013.01);
(Continued)

(58) Field of Classification Search
USPC ............... 257/213–413, 900, 902–903, 257/E21.19–E21.21, E21.394–E21.458,
(Continued)

(56) References Cited

U.S. PATENT DOCUMENTS 5,154,946 A * 10/1992 Zdebel ............ H01L 21/823878
257/370
9,219,117 B2 * 12/2015 Tschumakow ...... H01L 29/0653
(Continued)

*Primary Examiner* — Tram H Nguyen
(74) *Attorney, Agent, or Firm* — Viering, Jentschura & Partner mbB

(57) ABSTRACT

According to various embodiments, a semiconductor structure may include: a first source/drain region and a second source/drain region; a body region disposed between the first source/drain region and the second source/drain region, the body region including a core region and at least one edge region at least partially surrounding the core region; a dielectric region next to the body region and configured to limit a current flow through the body region in a width direction of the body region, wherein the at least one edge region is arranged between the core region and the dielectric region; and a gate structure configured to control the body region; wherein the gate structure is configured to provide a first threshold voltage for the core region of the body region and a second threshold voltage for the at least one edge region of the body region, wherein the first threshold voltage is less than or equal to the second threshold voltage.

18 Claims, 15 Drawing Sheets

(51) Int. Cl.
  *H01L 27/088* (2006.01)
  *H01L 29/10* (2006.01)
  *H01L 29/49* (2006.01)
  *H01L 21/8234* (2006.01)
  *H01L 29/423* (2006.01)
(52) U.S. Cl.
  CPC ...... *H01L 29/0653* (2013.01); *H01L 29/1095* (2013.01); *H01L 29/42376* (2013.01); *H01L 29/4916* (2013.01); *H01L 21/823412* (2013.01)
(58) Field of Classification Search
  USPC ......... 257/E21.615–E21.694, 439, 443, 655, 257/E27.1, E27.125, E27.112, E29.117, 257/E29.145, E29.147, E29.151, E29.182, 257/E29.202, E29.273–E29.299, E29.314, 257/E29.32, E23.016, E21.094, E21.104, 257/E21.121, E21.372, E21.411–E21.416, 257/66, 72, E21.7, E29.003, E29.095, 257/E29.148–E29.149, E29.265, 57, 59, 257/83, 257, 290, 351, 368, 392; 438/135, 142, 30, 48, 128, 149, 151, 157, 438/161, 283
  See application file for complete search history.

(56) References Cited

U.S. PATENT DOCUMENTS

| | | | |
|---|---|---|---|
| 2004/0041226 A1* | 3/2004 | Snyder | H01L 27/095 257/471 |
| 2008/0054371 A1* | 3/2008 | Beyer | H01L 29/7845 257/384 |
| 2009/0166765 A1* | 7/2009 | Lee | H01L 29/665 257/409 |
| 2009/0191675 A1* | 7/2009 | Mehrad | H01L 21/28097 438/218 |
| 2011/0317486 A1* | 12/2011 | Lu | G11C 11/404 365/182 |

* cited by examiner

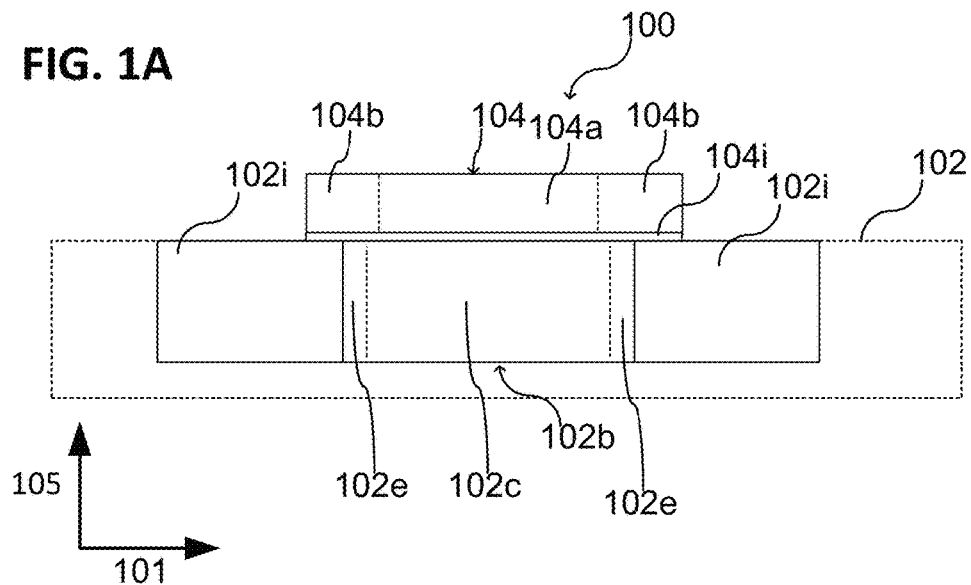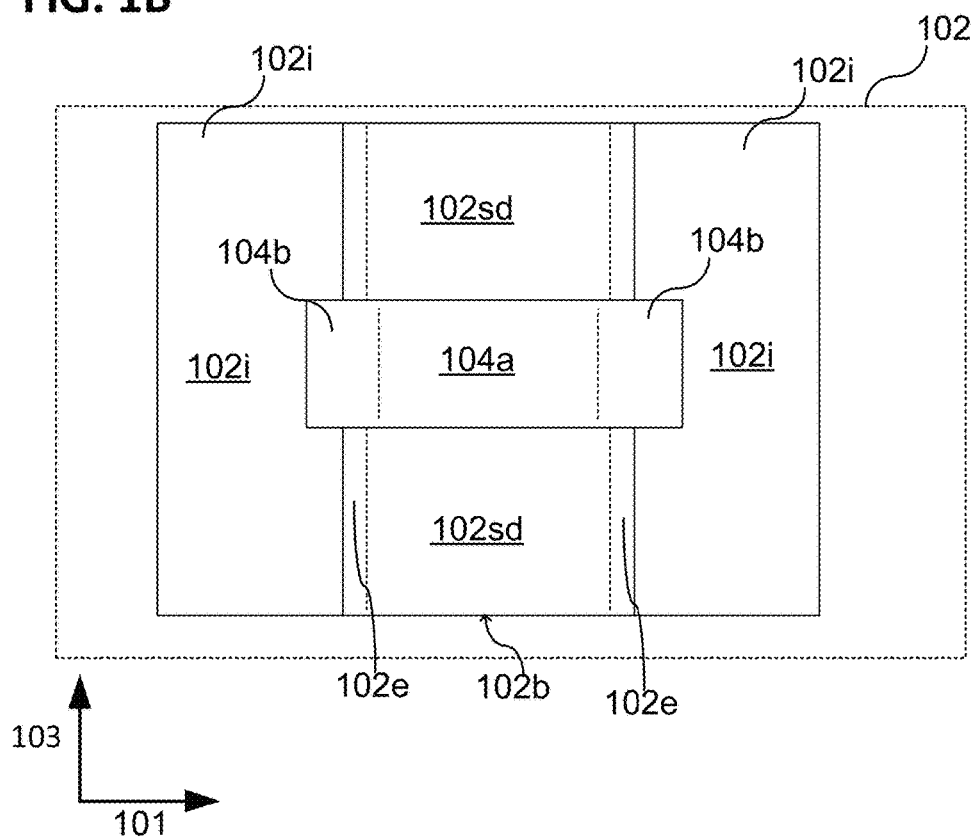

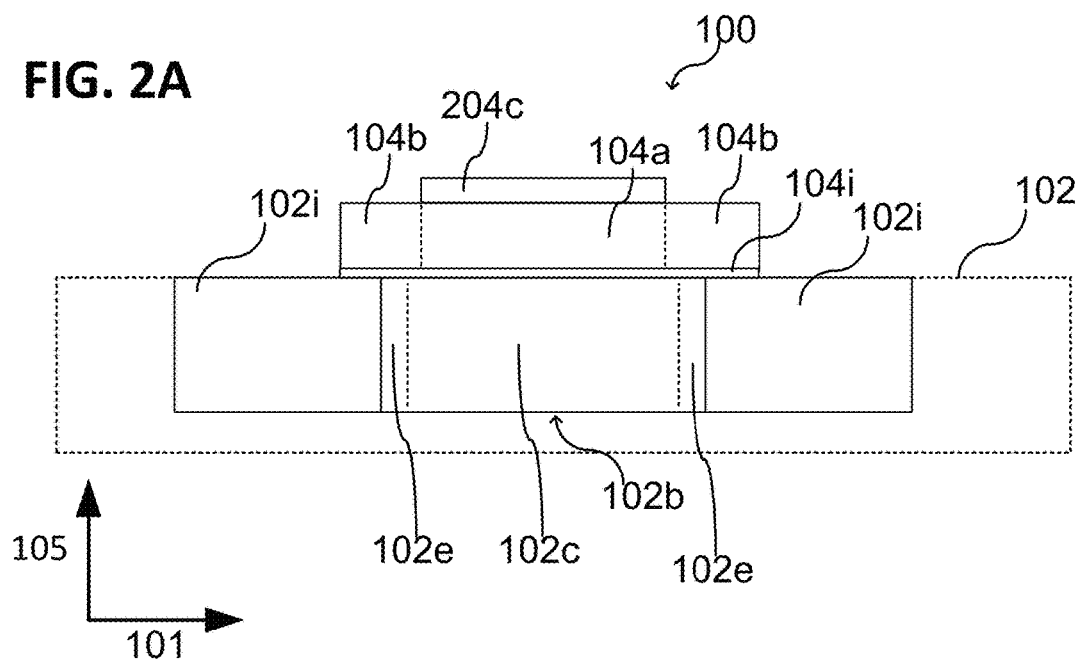
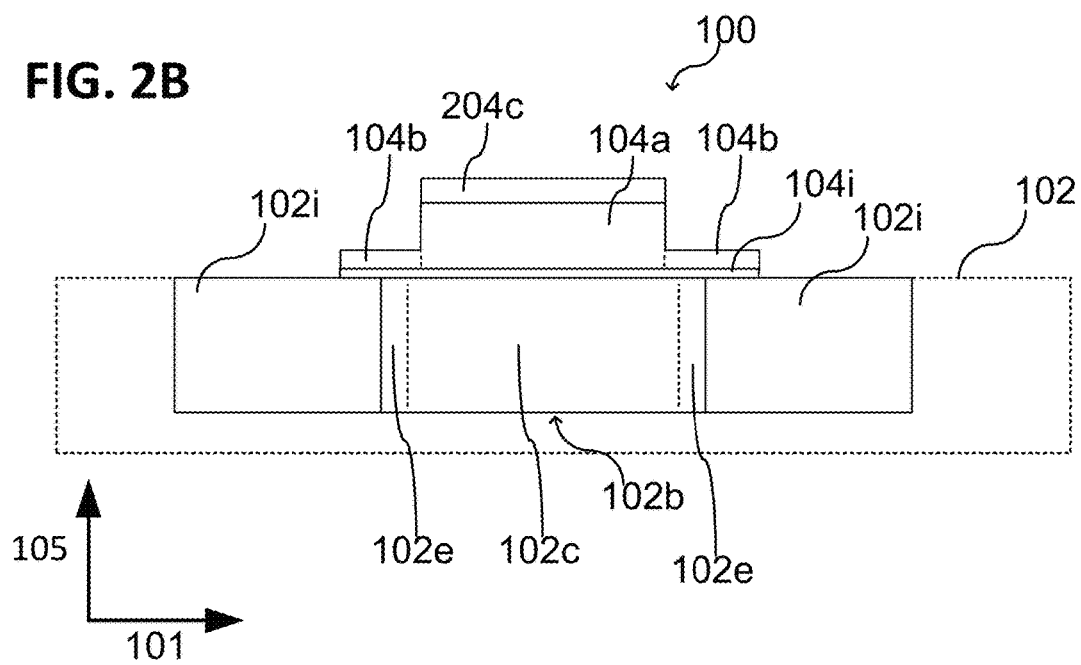

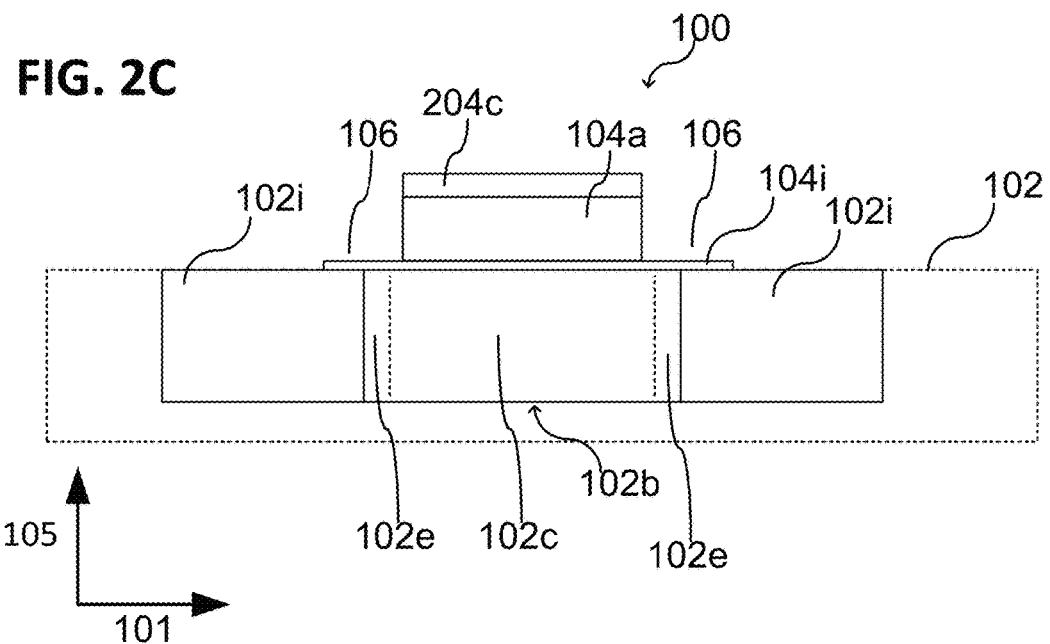

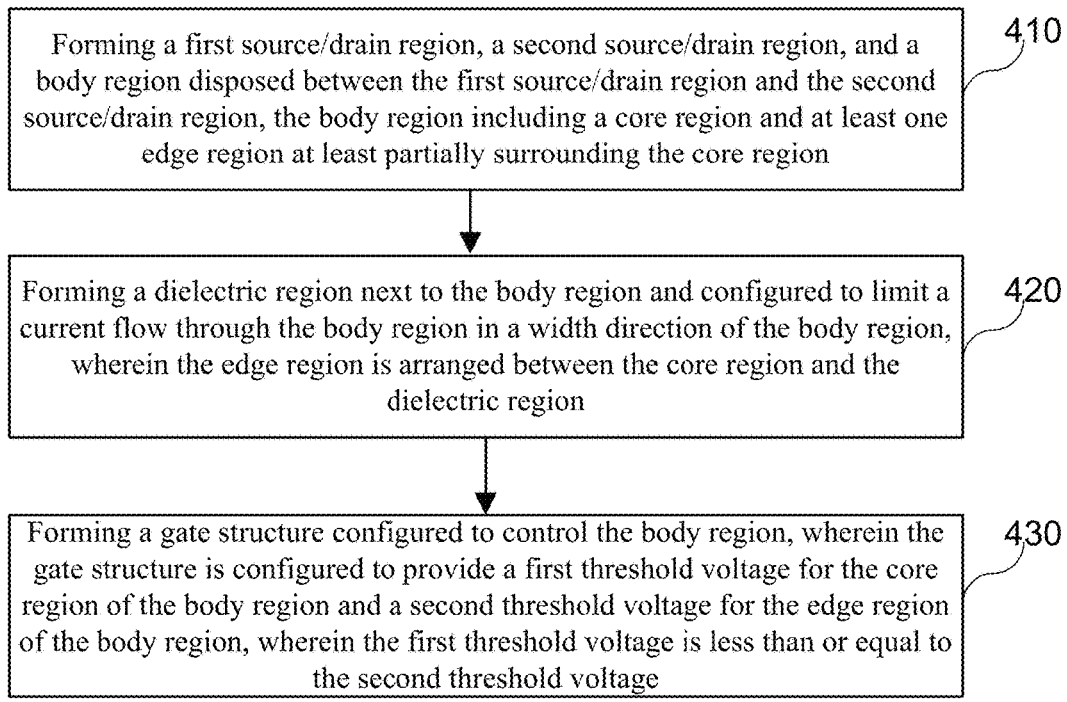

510 — Forming a transistor structure at least one of over an in the carrier, the transistor structure including: a first source/drain region and a second source/drain region; a body region disposed between the first source/drain region and the second source/drain region, the body region including a core region and an edge region at least partially surrounding the core region; a dielectric region next to the body region and configured to limit a current flow through the body region in a width direction of the body region, wherein the edge region is arranged between the core region and the dielectric region; and a gate structure configured to control the body region 520 — Processing at least one of a first portion of the gate structure or a second portion of the gate structure such that a first threshold voltage is provided for the core region of the body region and such that a second threshold voltage is provided for the edge region of the body region, wherein the first threshold voltage is equal to or smaller than the second threshold voltage

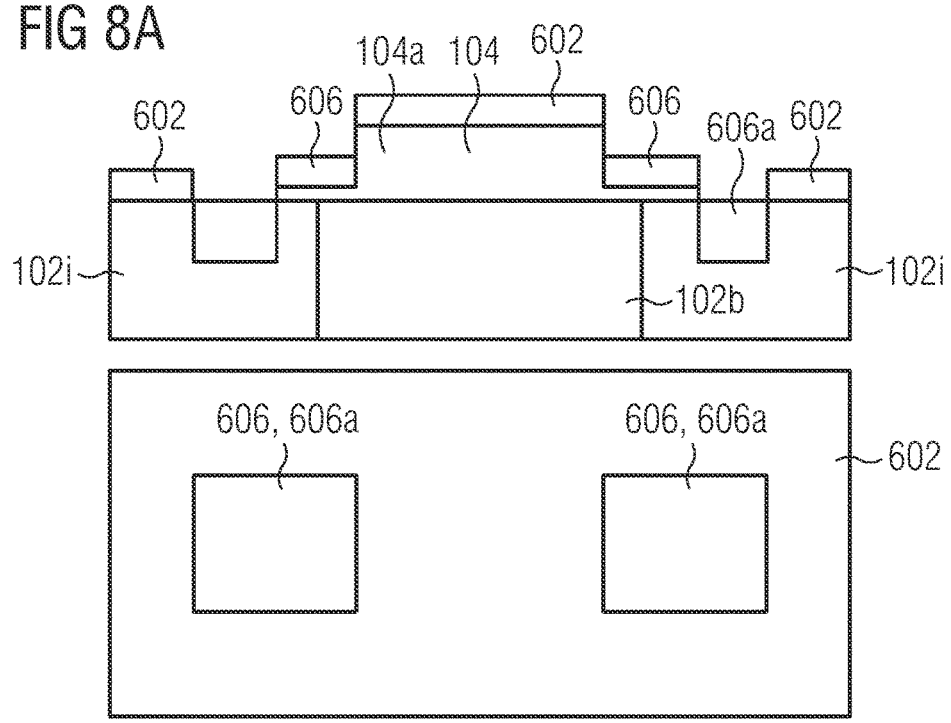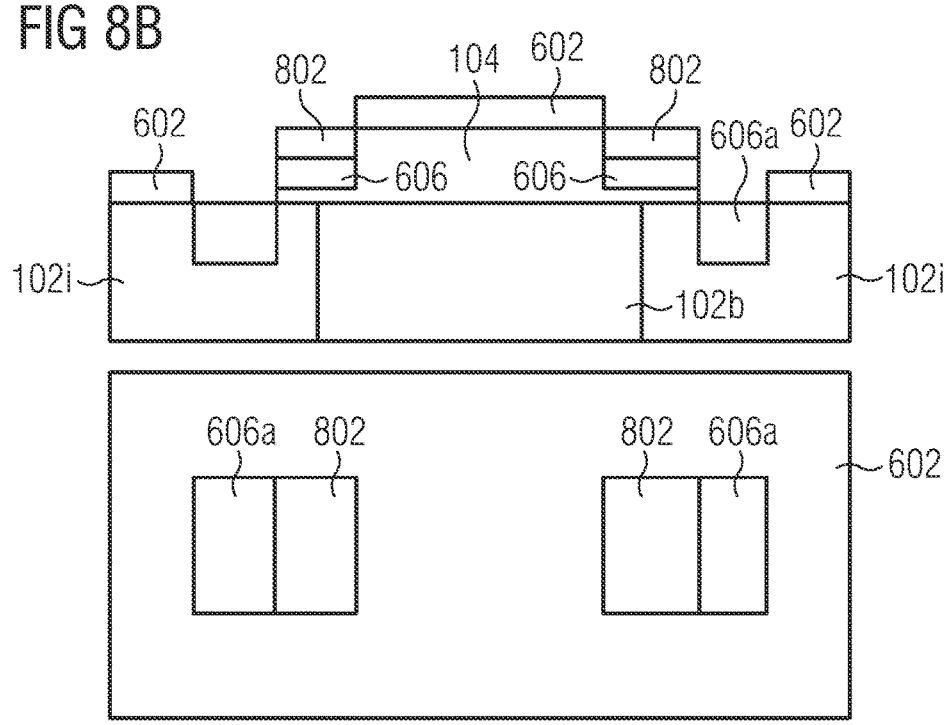

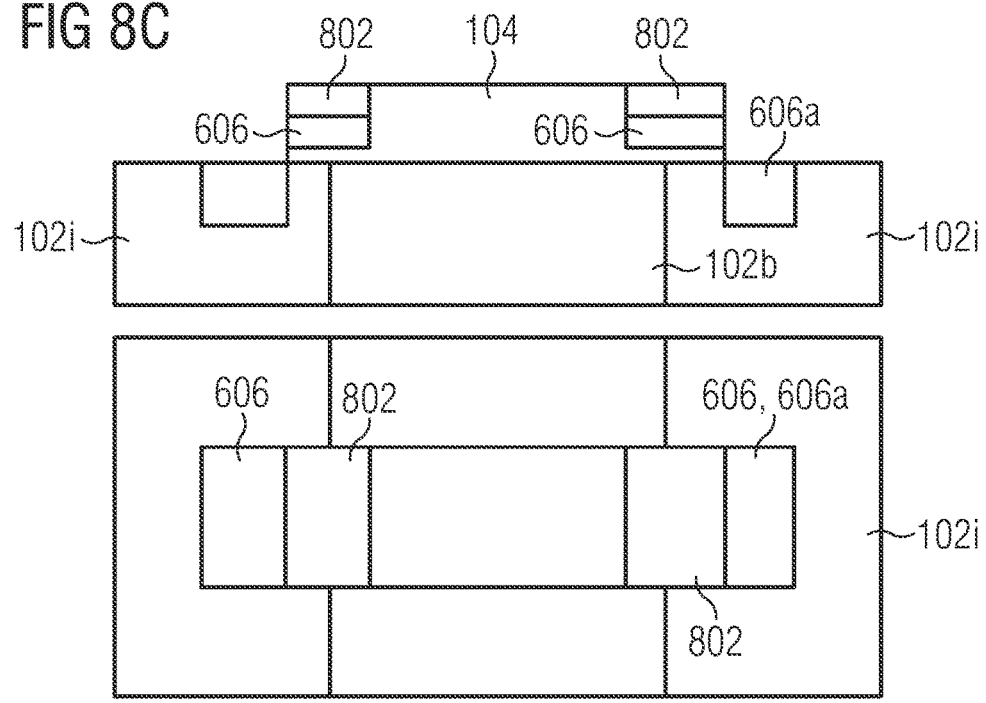
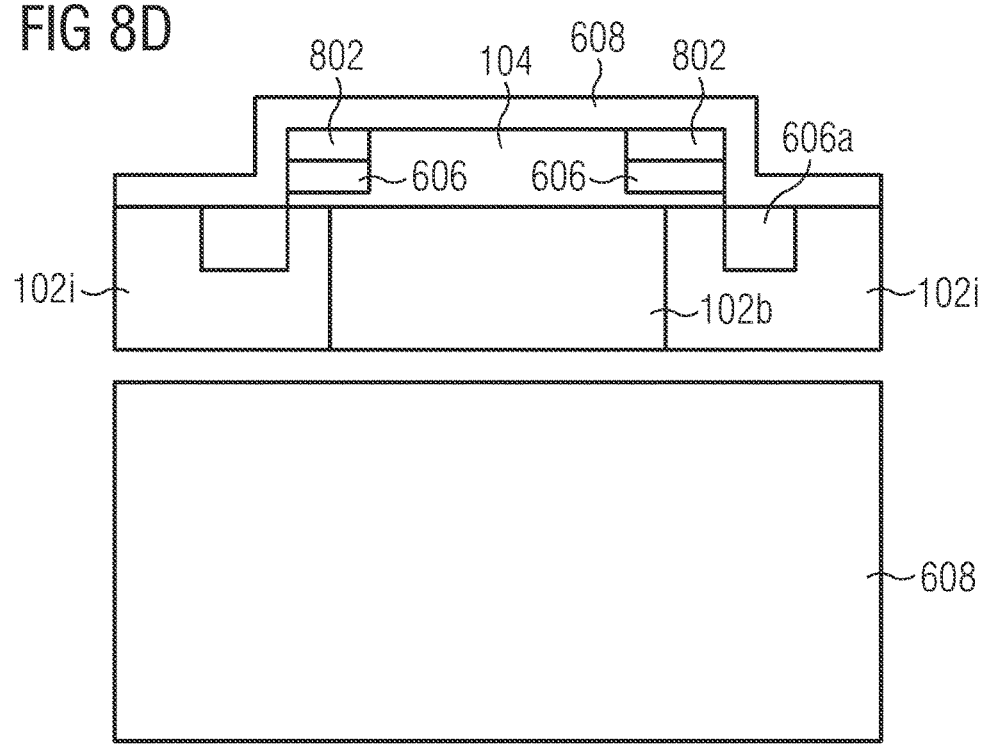

SEMICONDUCTOR STRUCTURE AND A METHOD FOR PROCESSING A CARRIER

RELATED APPLICATION

This application is a continuation of U.S. patent application Ser. No. 14/258,073, entitled "SEMICONDUCTOR STRUCTURE AND A METHOD FOR PROCESSING A CARRIER", filed on Apr. 22, 2014, which is incorporated herein by reference in its entirety.

TECHNICAL FIELD

Various embodiments relate generally to a semiconductor structure and a method for processing a carrier.

BACKGROUND

In general, there may be a variety of technologies in semiconductor industry to integrate a plurality of field effect transistors (FETs) into a carrier or wafer. The field effect transistors are typically electrically isolated from each other via a dielectric material disposed within the carrier between respectively adjacent FETs. A field effect transistor (FET) typically includes a body region (e.g. p-type or n-type), the body region connecting a source region with a drain region, and a gate region controlling the body region between the source region and the drain region. An electrical field is usually induced into the body region via the gate (e.g. via applying a voltage at the gate region, wherein the gate region is electrically isolated from the body region via a dielectric layer) such that the electrical conductivity of the body region may be varied to control a current flow between the source region and the drain region. A plurality of FETs (e.g. metal-oxide-semiconductor field-effect transistors (MOSFETs)) is typically integrated into a carrier or wafer, wherein the FETs may be separated from each other via so-called shallow trench isolation (STI) (e.g. also known as box isolation technique). However, other processes like local oxidation of silicon (LOCOS) or deep trench isolation may also be used to electrically separate the body regions or the active regions of adjacent FETs integrated into a carrier or wafer from each other.

SUMMARY

According to various embodiments, a semiconductor structure may include: a first source/drain region and a second source/drain region; a body region disposed between the first source/drain region and the second source/drain region, the body region including a core region and at least one edge region at least partially surrounding the core region; a dielectric region next to the body region and configured to limit a current flow through the body region in a width direction of the body region, wherein the at least one edge region is arranged between the core region and the dielectric region; and a gate structure configured to control the body region; wherein the gate structure is configured to provide a first threshold voltage for the core region of the body region and a second threshold voltage for the at least one edge region of the body region, wherein the first threshold voltage is less than or equal to the second threshold voltage.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A schematically shows a semiconductor structure in a cross sectional view, according to various embodiments;

FIG. 1B schematically shows a semiconductor structure in a top view, according to various embodiments;

FIGS. 2A to 2C show respectively a semiconductor structure in a schematic cross sectional view, according to various embodiments;

FIGS. 4 and 5 show respectively a schematic flow diagram of a method for processing a carrier, according to various embodiments;

FIGS. 8A to 8F show respectively a semiconductor structure in a schematic cross sectional view during processing, according to various embodiments.

DESCRIPTION

Figure 1C:
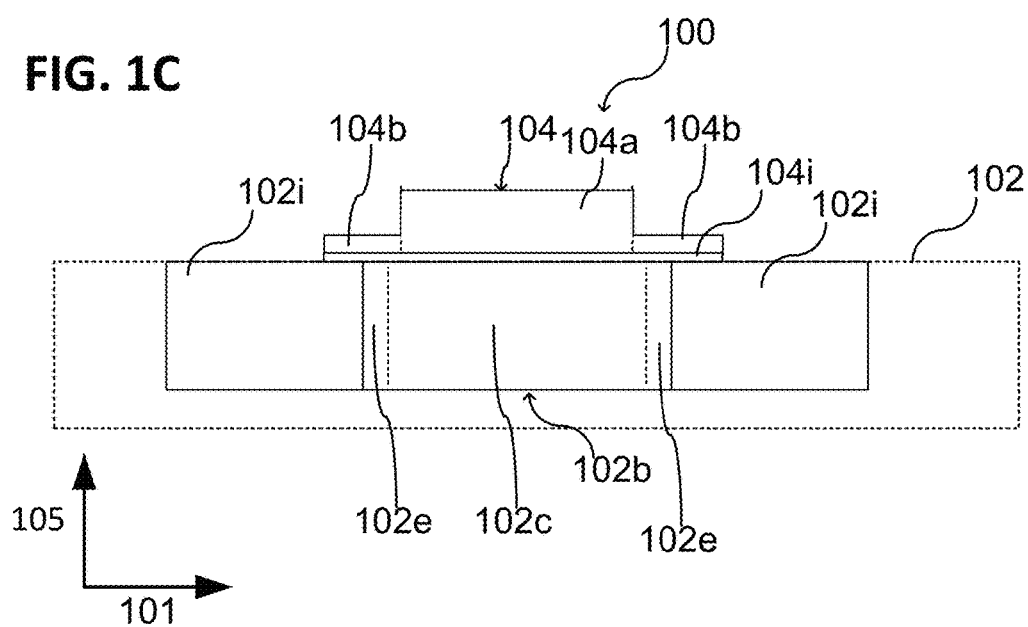
FIGS. 1C and 1D show respectively a semiconductor structure in a schematic cross sectional view, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a carrier) or "laterally" overlapping, may be used herein to mean an extension along a direction parallel to a surface of a carrier. That means that a surface of a carrier (e.g. a surface of a substrate, or a surface of a wafer) may serve as reference, commonly referred to as the main processing surface of a wafer (or the main processing surface of another type of carrier). Further, the term "width" used with regards to a "width" of a structure (or of a structure element, e.g. a cavity) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier).

According to various embodiments, the semiconductor structure may include a field effect transistor (FET) or a semiconductor switch based on the field effect (e.g. an insulated gate bipolar transistor IGBT, e.g. a thyristor). The semiconductor structure provided at least one of over or in a carrier or wafer may include at least three terminals, e.g. source, drain, and gate. Accordingly, a source region and a drain region may be formed in a body region of the carrier (or wafer) such that the source region and the drain region may be at least connected via a body region between the source region and the drain region, wherein a gate structure may be disposed over the body region between the source region and the drain region such that a current flow from the source region to the drain region can be provided and/or controlled via the gate structure, e.g. via applying a voltage (AC or DC) at the gate structure. Thereby, the electrical field generated by the gate structure may extend into the body region between the source region and the drain region providing and controlling a so-called channel, through which charge carriers, e.g. electrons or holes, can flow from the source to the drain.

The carriers may enter the channel through the source region and may leave the channel through the drain region. However, the source region and the drain region (the source/drain regions) may be defined by the respective use as source and/or drain. The channel conductivity and therefore the current flow between source and drain may be modified or controlled by the gate. According to various embodiments, the channel and the body region may have a width direction transverse to the current flow in the channel and a length direction parallel to the current flow in the channel. The width of the body region, and therefore the maximal width of the channel, between the source region and the drain region may be limited by a dielectric structure provided next to (laterally next to) the body region. In general, MOSFETs (metal-oxide-semiconductor field-effect transistors) may be processed in STI—(shallow trench isolation)—technology, wherein commonly processed MOSFETs may suffer from parasitic effects in the STI corner region (in the edge regions of the body region), e.g. in addition to a normal conduction in the channel of the MOSFET, which is linearly scaling with the channel width, a parasitic "corner device" with characteristics (e.g. threshold voltage, body effect, matching or noise) different from the channel is conducting in parallel. Illustratively, the gate may provide a channel including at least two channel regions conducting in parallel with different electronic properties due to different electronic properties of a first portion of the body region and a second portion of the body region. In a commonly used MOSFET design the parasitic "corner device" in parallel to the desired channel may switch earlier (at a lower threshold voltage) than the desired channel, which may cause problems for semiconductor structures with a small device width (e.g. with a body region width less than for example 100 μm). Therefore, an appropriate modeling of the semiconductor structure with a standard BSIM compact model (Berkeley Short-channel IGFET Model) may be difficult as homogenous device properties along the device width may be assumed for simulations.

In commonly applied semiconductor processing integrative measures may be performed to alleviate $V_{th}$—(threshold voltage)—lowering effects in the corner device region, i.e. the STI leveling may be reduced, the etch-back of STI fill may be reduced, or the STI edge shape may be adapted, wherein those measures may lower process margins for devices in other circuit elements, that are highly sensitive to changes in properties of the STI corner, such as for example flash or static memory.

FIG. 1A illustrates a semiconductor structure 100 in a schematic cross sectional view, according to various embodiments, wherein FIG. 1B shows a corresponding top view of the semiconductor structure 100. The semiconductor structure 100 may be a transistor, e.g. a FET, a Fin-FET, a MOSFET, an n-type MOSFET, a p-type MOSFET, a part of a semiconductor device, or a part of a semiconductor switch. FIG. 1A shows a cross section 101, 105 of the semiconductor structure 100 perpendicular to the length direction 103 in which a current may flow from the source to the drain.

According to various embodiments, the semiconductor structure 100 may be formed or disposed at least one of over or in a carrier 102 (or a wafer 102). According to various embodiments, a plurality of semiconductor structures 100 may be formed or disposed at least one of over or in a carrier 102, e.g. laterally next to each other, wherein the semiconductor structures 100 may be electrically separated from each other via one or more dielectric regions 102i provided in the carrier 102. According to various embodiments, the carrier 102 may be any type of carrier 102 being processable in semiconductor processing, e.g. a semiconductor wafer, e.g. a silicon wafer, a carrier including a semiconductor layer or a carrier including a silicon layer. According to various embodiments, semiconductor materials of the carrier 102 may further include germanium, Group III to V elements, polymers, gallium arsenide (GaAs), indium phosphide (InP), but also any suitable ternary semiconductor compound material such as indium gallium arsenide (InGaAs) or quaternary semiconductor compound material. In an embodiment, the wafer substrate may be made of silicon (doped or undoped), in an alternative embodiment, the wafer substrate may be a silicon on insulator (SOI) wafer.

According to various embodiments, the dielectric regions 102i provided in the carrier 102 to electrically separate respectively adjacent semiconductor structures 100 in the carrier 102 may include at least one dielectric material as for example silicon oxide, a metal oxide, or a half metal oxide. According to various embodiments, the one or more dielectric regions 102i may be formed in STI technology, e.g. via forming a trench or a trench structure in the carrier 102 and filling or at least partially filling the trench or the trench structure with a dielectric material.

As illustrated in FIG. 1A, a body region 102b may be provided in the carrier 102, the body region 102b being laterally limited via the dielectric regions 102i along the width direction 101 of the semiconductor structure 100. Illustratively, the dielectric regions 102i may limit a current flow along the width direction 101 of the body region 102b such that a plurality of semiconductor structures 100 can be provided at least one of over or in the carrier 102, the plurality of semiconductor structures 100 not interfering with each other.

According to various embodiments, the body region 102b may include a core region 102c and an edge region 102e, the edge region facing the dielectric regions 102i and/or being in physical contact with the dielectric regions 102i. According to various embodiments, due to the dielectric regions 102i, the edge region 102e of the body region 102b may differ from the core region 102c in electronic properties, e.g. in charge carrier concentration, electronic band structure, doping concentration, microstructure, thickness, surface roughness, and the like. Therefore, the switching behavior of the edge region 102e may differ from the switching behavior of the core region, which may be considered in the design and or structure of a gate structure 104 being disposed over the body region 102b (over the core region 102c and over the edge region 102e).

According to various embodiments, the gate structure 104 may laterally extend over the body region 102b along the width direction 101. The gate structure 104 may include a first gate region 104a overlapping the core region 102c of the body region 102b to substantially control the core region 102c, e.g. to provide or modulate a channel extending in the core region 102c of the body region 102b. Further, according to various embodiments, the gate structure 104 may include at least one second gate region 104b (e.g. two second gate regions 104b) overlapping the at least one edge region 102e (e.g. two edge regions 102e) of the body region 102b. Further, according to various embodiments, the at least one second gate region 104b may (e.g. optionally) partially overlap the dielectric regions 102i. According to various embodiments, the at least one second gate region 104b may substantially control the at least one edge region 102e of the body region 102b, e.g. to provide or modulate a channel extending in the at least one edge region 102c of the body region 102b. According to various embodiments, the first gate region 104a and the at least one second gate region 104b may be electrically separated from the body region 102b via a dielectric layer 104i, for example via a so-called field oxide or gate oxide, e.g. via a high-κ dielectric material, e.g. via silicon oxide, e.g. via a transition metal oxide, e.g. via a multilayer including for example silicon oxide.

According to various embodiments, the first gate region 104a may be configured to provide a first threshold voltage for the core region 102c of the body region 102b and the at least one second gate region 104b may be configured to provide a second threshold voltage for the at least one edge region 102e (or for both edge regions 102e) of the body region 102b, wherein the first threshold voltage is substantially equal to or less than the second threshold voltage, such that the core region 102c may dominate the switching characteristic of the semiconductor structure 100.

According to various embodiments, the width of the body region 102b along the direction 101 may be in the range from about a few nanometers to about several tens of micrometers, e.g. in the range from about 10 nm to about 50 μm. According to various embodiments, the width of the body region 102b along the direction 101 may be less than 100 μm, e.g. less than 50 μm, e.g. less than 40 μm, e.g. less than 30 μm, e.g. less than 20 μm, e.g. less than 10 μm, e.g. less than 5 μm.

According to various embodiments, the width of the edge region 102e (the width of each edge region 102e of the both edge regions 102e) along the direction 101 may be in the range from about 1% to about 20% of the width of the body region 102b.

According to various embodiments, the width of the at least one edge region 102e may be defined by the processing of the dielectric regions 102i and/or of the carrier 102, which may influence or may vary the electronic properties of a part of the body region 102b causing the at least one edge region 102e.

According to various embodiments, the semiconductor structure 100 may include a first source/drain region 102sd and a second source/drain region 102sd, as illustrated in FIG. 1B. The semiconductor structure 100 may further include a body region 102b disposed between the first source/drain region 102sd and the second source/drain region 102sd, wherein the body region 102b may include a core region 102c and at least one edge region 102e, the at least one edge region 102e at least partially surrounding the core region 102c. The semiconductor structure 100 may further include a dielectric region 102i next to the body region 102b and the dielectric region 102i may be configured to limit a current flow through the body region 102b along a width direction 101 of the body region 102b, wherein the at least one edge region 102e may be arranged between the core region 102c and the dielectric region 102i. The semiconductor structure 100 may further include a gate structure 104 configured to control the body region 102b, wherein the gate structure 104 may be configured to provide a first threshold voltage for the core region 102c of the body region 102b and a second threshold voltage for the at least one edge region 102e of the body region 102b, wherein the first threshold voltage is less than or substantially equal to the second threshold voltage.

Therefore, in case the first threshold voltage is substantially equal to the second threshold voltage, a homogenous switching channel can be provided in the complete body region 102b by applying an overdrive voltage greater than the first threshold voltage at the gate 104. Otherwise, in case the first threshold voltage is less than the second threshold voltage, a homogenous switching channel may be provided only in the core region 102c of the body region 102b by applying an overdrive voltage at the gate 104 greater than the first threshold voltage and less than the second threshold voltage. In both cases, the corner device caused by the edge regions 102e of the body region 102b may not dominate the switching of the semiconductor structure 100. Illustratively, the gate structure 104 may be configured to reduce the influence of the edge regions 102e of the body region 102b on the switching characteristics of the semiconductor structure 100.

Therefore, according to various embodiments, the gate structure 104 may include a gate region 104a, 104b (including for example polysilicon, e.g. doped or partially doped polysilicon) and a dielectric layer (a gate oxide) disposed between the gate region 104a, 104b and the body region 102b, wherein the gate region 104a, 104b may include a first portion 104a at least overlapping the core region 102c of the body region 102b and at least one second portion 104b laterally next to the first portion 104a, the second portion 104b at least overlapping the at least one edge region 102e of the body region 102b.

According to various embodiments, the gate region 104a, 104b may be doped via one or more dopants, e.g. for an n-type doped body region 102b the source/drain regions 102sd may be p-type doped and the gate region 104a, 104b may be p-type doped as well during the same p-type doping process, e.g. for a p-type doped body region 102b the source/drain regions 102sd may be n-type doped and the gate region 104a, 104b may be n-type doped as well during the same n-type doping process. According to various embodiments, the at least one second portion 104b of the gate region 104a, 104b may be for example counter-doped such that the first portion 104a of the gate region 104a, 104b differs from the at least one second portion 104b of the gate region 104a, 104b in the doping type. According to various embodiments, the at least one second portion 104b of the gate region 104a, 104b may be for example additionally doped such that the first portion 104a of the gate region 104a, 104b differs from the at least one second portion 104b of the gate region 104a, 104b in the doping concentration.

Illustratively, the first portion 104a of the gate region 104a, 104b may differ for example from the at least one second portion 104b of the gate region 104a, 104b in the dominating doping type and/or the doping concentration. According to various embodiments, the first portion 104a of the gate region 104a, 104b may be n-type doped with a first doping concentration and the at least one second portion 104b of the gate region 104a, 104b may be n-type doped with a second doping concentration less than the first doping concentration. According to various embodiments, the electrical conductivity (e.g. the R-C-constant for an AC-voltage) of the first portion 104a of the gate region 104a, 104b may be greater than the electrical conductivity of the at least one second portion 104b of the gate region 104a, 104b.

According to various embodiments, the first portion 104a of the gate region 104a, 104b may be doped (e.g. n-type or p-type) and the at least one second portion 104b of the gate region 104a, 104b may be undoped, e.g. the at least one second portion 104b of the gate region 104a, 104b may be protected from ion implantation during the doping of the first portion 104a of the gate region 104a, 104b and/or during the doping of the source/drain regions 102sd.

As illustrated in FIG. 1C, according to various embodiments, the first portion 104a of the gate region may have a first thickness and the at least one second portion 104b of the gate region may have a second thickness, wherein the first thickness is greater than the second thickness. According to various embodiments, the at least one second portion 104b of the gate region may be thinned, e.g. via an etch process.

Figure 1D:
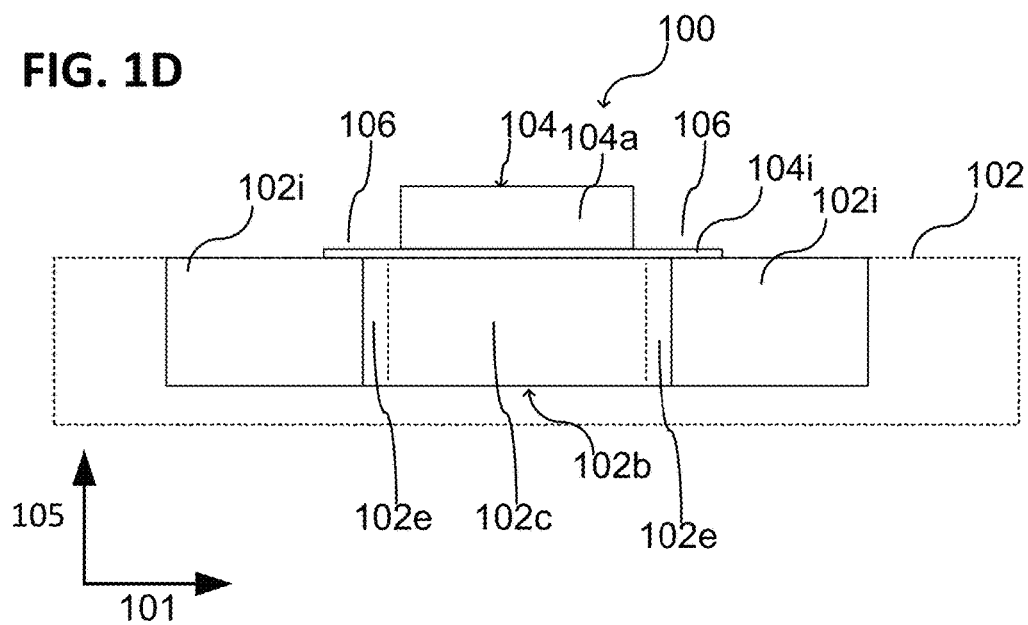

As illustrated in FIG. 1D, according to various embodiments, the at least one second portion 104b of the gate region may be completely removed. In other words, the gate structure 104 may laterally extend over the core region 102c of the body region 102b and not overlapping the at least one edge region 102e of the body region 102b. According to various embodiments, the width of the gate structure 104 overlapping the core region 102c along the width direction 101 may be less than the width of the body region 102b.

According to various embodiments, at least a part of the insulating layer 104i (the gate oxide) may be free from the gate region 104a, 104b.

According to various embodiments, the semiconductor structure 100 illustrated in FIGS. 1A to 1D may be covered or embedded into a dielectric passivation layer, e.g. the dielectric passivation layer providing a part of a metallization for the semiconductor structure 100. In other words, the semiconductor structure 100 may further include at least one metallization structure for electrically contacting the gate structure and the source/drain regions 102sd. According to various embodiments, the gate region 104a, 104b may or may not partially overlap the dielectric regions 102i. According to various embodiments, the gate region 104a, 104b may or may not partially overlap the edge region 102e of the body region 102b.

FIGS. 2A to 2C respectively show a semiconductor structure 100 in a schematic cross sectional view, according to various embodiments, wherein the gate structure 104 may be at least partially electrically contacted via a contact layer 204c provided at least partially over the gate structure 104. According to various embodiments, the first portion 104a and the second portion 104b of the gate region may include polysilicon.

As illustrated in FIG. 2A and FIG. 2B, according to various embodiments, the first portion 104a of the gate region may be covered with a contact layer 204c, e.g. with a metal, e.g. copper or aluminum. According to various embodiments, the contact layer 204c may include a metal silicide. According to various embodiments, the at least one second portion 104b of the gate region (or both second portions 104b of the gate region) may be free from the contact layer 204c. Additionally, the at least one second portion 104b of the gate region may be covered with an oxide layer, e.g. in physical contact with the at least one second portion 104b of the gate region.

As illustrated in FIG. 2C, according to various embodiments, the gate region 104a overlapping the core region 102c of the body region 102b may be covered (e.g. completely) with a contact layer 204c.

Partially contacting the gate region, as illustrated for example in FIGS. 2A and 2B, may change the AC—(alternating current, alternating voltage, or alternating power)—characteristics of the at least one second portion of the gate region, e.g. the R-C constant, the damping, or the inertia of the at least one second portion of the gate region may be great such that, if an alternating current/voltage is applied to the gate structure 104, the at least one second portion of the gate region may have a reduced ability of providing an electrical field for the at least one edge region 102e of the body region 102b, e.g. at a frequency greater than about 100 Hz, or e.g. greater than about 1 kHz, or e.g. greater than about 10 kHz, or even greater.

According to various embodiments, the at least one second portion of the gate region may be configured as low-pass filter. In this case, a higher AC-voltage may be necessary to provide or modulate a channel in the at least one edge region 102e of the body region 102b compared to the core region 102c of the body region 102b such that the second threshold voltage of the at least one edge region 102e is larger than or equal to the first threshold voltage of the core region 102c of the body region 102b.

According to various embodiments, the first portion 104a of the gate region may include silicon and the electrically conductive layer 204c may include a metal silicide electrically contacting the first portion 104a of the gate region.

According to various embodiments, the work function of the gate region may be partially modified, e.g. by a local gate implant or by a local gate thinning and/or by silicide blocking which can be applied simultaneously as well as separately from each other. The work function of the gate may influence the threshold voltage for the respective channel or part of the channel to be controlled.

Figure 3:
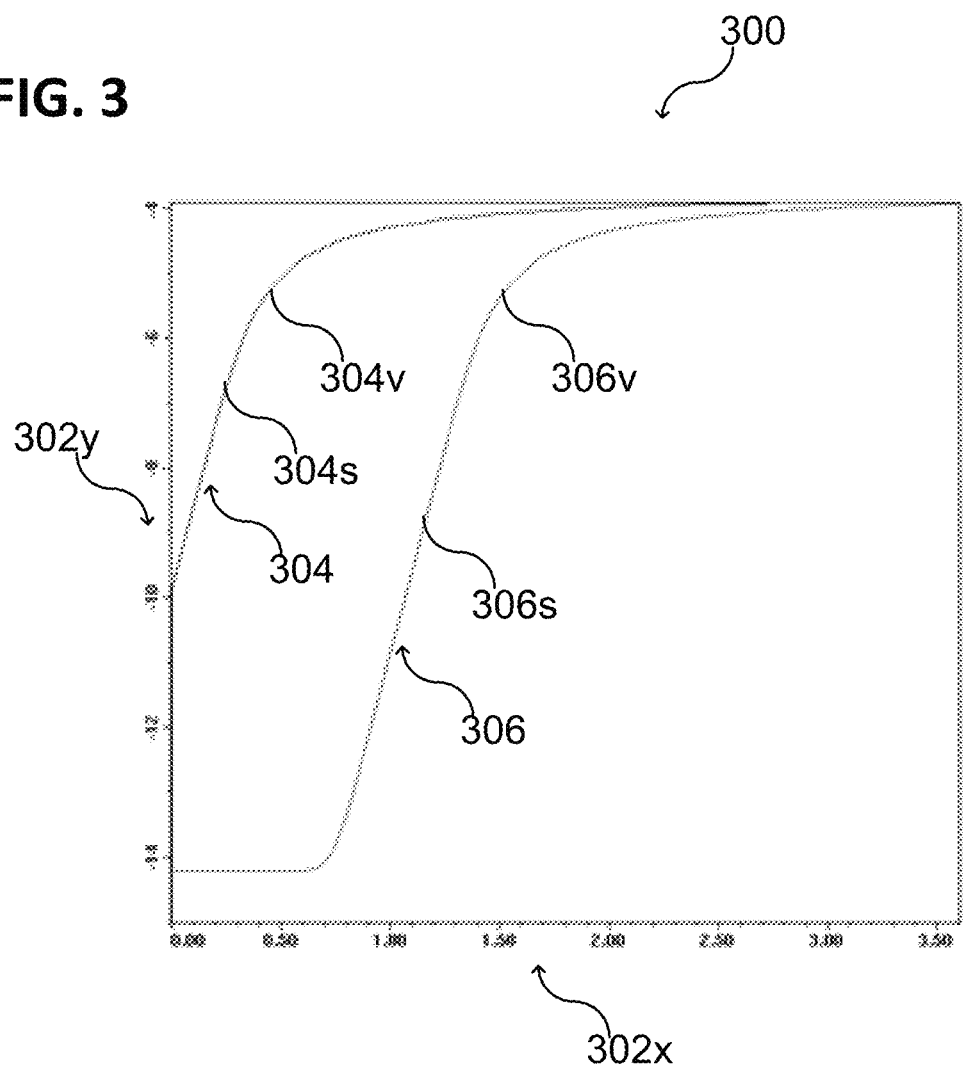
FIG. 3 shows a current-voltage characteristic of a semiconductor structure, according to various embodiments.

FIG. 3 illustrates I-V-characteristics (current $302y$-voltage $302x$) of an n-type MOSFET with an n-type doped 304 gate region and with a p-type doped 306 or p-type counter-doped 306 gate region. According to various embodiments, the gate work function may influence the threshold voltage of the MOSFET, e.g. the $V_{th}$ (threshold voltage $304v$) may shift about 1 V (to threshold voltage $306v$) with changing from high dose n-doped 304 to high dose p-doped gate 306. Therefore the gate may be modified (via doping the gate) to adapt the I-V-characteristics of the semiconductor structure 100.

According to various embodiments, the threshold voltage, $V_{th}$, of a field-effect transistor (FET) may be referred to herein as the value of the gate-source voltage necessary for providing a channel from the source region 102sd to the drain region 102sd which may allow a significant current flow from the source to the drain. The threshold voltage may consider drain-induced barrier lowering and/or sub-threshold leakage such that there may be a current $302y$ even for gate biases below the threshold voltage (e.g. a sub-threshold leakage). According to various embodiments, in the sub-threshold regime (sub-threshold operation mode) $304s$, $306s$ of a semiconductor structure 100 the leakage current $302y$ may vary exponentially with the gate bias voltage $302x$. This may also define the threshold voltage $304v$, $306v$ at the upper limit of the sub-threshold regime $304s$, $306s$. In FIG. 3 the current $302y$ is plotted logarithmically such that a linear sub-threshold slope 304s, 306s may be a feature of a MOSFET's current-voltage characteristic 300.

According to various embodiments, the gate work function influences the sub-threshold regime of the MOSFET, e.g. the threshold voltage 304v, 306v and the sub-threshold slope 304s, 306s, which may be shifted about 1 V with changing from a high dose n-type doped to a high dose p-type doped gate, as illustrated in FIG. 3. Therefore the gate may be modified to adapt the I-V-characteristics, e.g. the threshold voltage 304v, 306v and/or the sub-threshold regime 304s, 306s of the semiconductor structure 100.

According to various embodiments, if the semiconductor structure 100 is operated in AC-operation mode, the response of the channel to the AC-voltage applied at the gate region may be frequency depended. Further, in AC-operation mode, the threshold voltage may be regarded as the frequency depended coupling strength of the gate to the body region to provide and/or to modulate the channel (e.g. the ability of the respective gate region to modulate the electrical conductivity of the core region 102c and edge region 102e of the body region 102b).

According to various embodiments, as described before, a semiconductor structure 100 may include: a first source/drain region 102sd and a second source/drain region 102sd; a body region 102b disposed between the first source/drain region 102sd and the second source/drain region 102sd, the body region 102b including a core region 102c and at least one edge region 102e at least partially surrounding the core region 102c; a dielectric region 102i next to the body region 102b, wherein the dielectric region 102i is configured to limit a current flow through the body region 102b in a width direction 101 of the body region 102b, wherein the at least one edge region 102e may be arranged between the core region 102c and the dielectric region 102i; and a gate structure 104 configured to control the body region 102b; wherein the gate structure 104 may include a first (e.g. polysilicon) portion 104a overlapping the core region 102c of the body region 102b and at least one second (e.g. polysilicon) portion 104b overlapping the at least one edge region 102e of the body region 102b, wherein the first portion 104a is electrically contacted via a layer 204c and wherein the second portion 104b is free from the layer 204c such that the second portion 104b is indirectly electrically conductively connected to the layer 204c via the first portion 104a. According to various embodiments, since the gate region 104a, 104b may be partially electrically contacted, the AC-properties of the gate structure 104 can be varied such that the edge region 102e of the body region 102b may be less influenced compared to a gate being completely covered with an electrically conductive contact layer in commonly used transistor designs.

Additionally, the one or more second portions 104b of the gate region may be thinned or may be provided with a smaller thickness than the first portion 104a which causes the one or more second portions 104b of the gate region to act as a low-pass filter, according to various embodiments.

Accordingly, the first portion 104a of the gate region may substantially control the core region 102c of the body region 102b and the at least one second portion 104b of the gate region may substantially control the at least one edge region 102e of the body region 102b such that the properties of the at least one edge region 102e (the corner device) of the body region 102b may be adapted via modifying the gate structure 104.

According to various embodiments, as described before, a semiconductor structure 100 may include: a first source/drain region 102sd and a second source/drain region 102sd; a body region 102b disposed between the first source/drain region 102sd and the second source/drain region 102sd, the body region 102b including a core region 102c and at least one edge region 102e at least partially surrounding the core region 102c; a dielectric region 102i disposed next to the body region 102b and configured to limit a current flow through the body region 102b in a width direction 101 of the body region 102b, wherein the at least one edge region 102e may be arranged between the core region 102c and the dielectric region 102i; and a gate structure 104 configured to control the body region 102b; wherein the gate structure 104 may include a first (e.g. polysilicon) region 104a overlapping the core region 102c of the body region 102b and at least one second (e.g. polysilicon) region 104b overlapping the at least one edge region 102e of the body region 102b, wherein the first portion 104a may include the same doping type as the source/drain regions 102sd and wherein the second portion 104b may include the opposite doping type as the first portion 104a.

FIG. 4 shows a schematic flow diagram of a method 400 for processing a carrier 102, according to various embodiments. The method 400 for processing a carrier 102 may include: in 410, forming a first source/drain region 102sd and a second source/drain region 102sd in a carrier 102 such that a body region 102b may be disposed between the first source/drain region 102sd and the second source/drain region 102sd, the body region 102b including a core region 102c and at least one edge region 102e at least partially surrounding the core region 102c; in 420, forming a dielectric region 102i (or more than one dielectric regions, e.g. two elongated dielectric regions 102i) next to the body region 102b, wherein the dielectric region 102i may be configured to limit a current flow through the body region 102b in a width direction 101 of the body region 102b, wherein the edge region 102e may be arranged between the core region 102c and the dielectric region 102i; and, in 430, forming a gate structure 104 configured to control the body region 102b, wherein the gate structure may be configured to provide a first threshold voltage for the core region 102c of the body region 102b and a second threshold voltage for the edge region 102e of the body region 102b, wherein the first threshold voltage is less than or equal to the second threshold voltage.

According to various embodiments, the dielectric regions 102i may be formed into the carrier 102 before or after the source/drain regions 102sd may be implanted into the carrier 102, wherein the remaining carrier material between the source/drain regions 102sd may provide the body region 102b, e.g. p-type or n-type.

According to various embodiments, the gate structure 104 may be formed before or after the source/drain regions 102sd may be implanted into the carrier 102. According to various embodiments, the gate structure 104 may be formed over the carrier 102, wherein subsequently the source/drain regions 102sd may be implanted into the carrier 102 such that at the same time the polysilicon of the gate structure 104 may be doped as well, e.g. p-type or n-type.

FIG. 5 shows a schematic flow diagram of a method 500 for processing a carrier 102, according to various embodiments. According to various embodiments, the method 500 for processing a carrier 102 may include: in 510, forming a transistor structure 100 at least one of over an in the carrier 102, the transistor structure 100 including: a first source/drain region 102sd and a second source/drain region 102sd; a body region 102b disposed between the first source/drain region 102sd and the second source/drain region 102sd, the body region 102b including a core region 102c and an edge region 102e, the edge region 102e at least partially surrounding the core region 102c; a dielectric region 102i next to the body region 102b, the dielectric region 102i configured to limit a current flow through the body region 102b in a width direction 101 of the body region 102b, wherein the edge region 102e may be arranged between the core region 102c and the dielectric region 102i; and a gate structure 104 configured to control the body region 102b; and, in 520, processing at least one of a first portion 104a of the gate structure 104 or a second portion 104b of the gate structure 104 such that a first threshold voltage is provided for the core region 102c of the body region 102b and such that a second threshold voltage is provided for the edge region 102e of the body region 102b, wherein the first threshold voltage is equal to or smaller than the second threshold voltage.

According to various embodiments, the method 500 for processing a carrier 102 may alternatively include: in 520, doping at least one of a first portion 104a of the gate structure 104 or a second portion 104b of the gate structure 104 such that the first portion 104a of the gate structure 104 may differ from the second portion 104b of the gate structure 104 in at least one of doping type or doping concentration.

According to various embodiments, the method 500 for processing a carrier 102 may alternatively include: in 520, thinning the gate structure 104 partially such that a first portion 104a of the gate structure 104 overlapping the core region 102c has a greater thickness than a second portion 104b of the gate structure 104 overlapping the edge region 102e. According to various embodiments, the first portion 104a of the gate structure 104 may have a thickness in the range from about several nanometers to about several micrometers, e.g. in the range from about 50 nm to about 1 µm. Accordingly, the at least one second portion 104b of the gate structure 104 may have a thickness in the range from about 0 to about 90%, e.g. in the range from about 0 to about 80%, e.g. in the range from about 0 to about 70%, e.g. in the range from about 0 to about 60%, e.g. in the range from about 0 to about 50%, e.g. in the range from about 0 to about 40%, e.g. in the range from about 0 to about 30%, e.g. in the range from about 0 to about 20%, e.g. in the range from about 0 to about 10%, of the thickness of the first portion 104a of the gate structure 104.

According to various embodiments, the method 500 for processing a carrier 102 may alternatively include: in 520, electrically contacting the gate structure 104 partially such that a first portion 104a of the gate structure 104 overlapping the core region 102c may be electrically contacted via a contact layer 204c (e.g. in physical contact), wherein at least one second portion 104b of the gate structure 104 overlapping the edge region 102e may be free from the contact layer 204c. Illustratively, the area above the at least one second portion 104b of the gate structure 104 may be free from the contact layer 204c.

Various modifications and/or configurations of the semiconductor structure 100 and details referring to the gate structure 104 and the processing of the carrier for forming the semiconductor structure 100 are described in the following, wherein the features and/or functionalities described before may be included analogously. Further, the features and/or functionalities described in the following may be included in the semiconductor structure 100 or may be combined with the semiconductor structure 100, as described before referring for example to FIGS. 1A to 1D and FIGS. 2A to 2C.

In the following FIGS. 6A to 6D a carrier 102 is illustrated respectively in a schematic cross sectional view at various stages during processing, according to various embodiments, e.g. during a method for processing a carrier 100, e.g. during method 400, 500 is carried out or after method 400, 500 has been carried out. Further, according to various embodiments, FIGS. 7A to 7F respectively illustrate the carrier 102 during a further processing including doping the gate structure 104 and FIGS. 8A to 8F respectively illustrate the carrier 102 during a further processing including doping the gate structure 104 and partially contacting the gate structure 104. However, partially contacting the gate structure 104, as described with reference to FIGS. 8A to 8F, may be alternatively performed without doping the gate structure 104 such that the AC-properties of the gate structure 104 are modified due to the partially contacting. The upper images in each of the following figures shows the cross section of a transistor along the gate direction, wherein the lower image shows the top view of the semiconductor structure 100. Further, in the following figures, the dielectric layer of the gate structure 104 electrically isolating for example the polysilicon gate region from the body region 102b may not be illustrated for a better visibility.

Figure 6A:
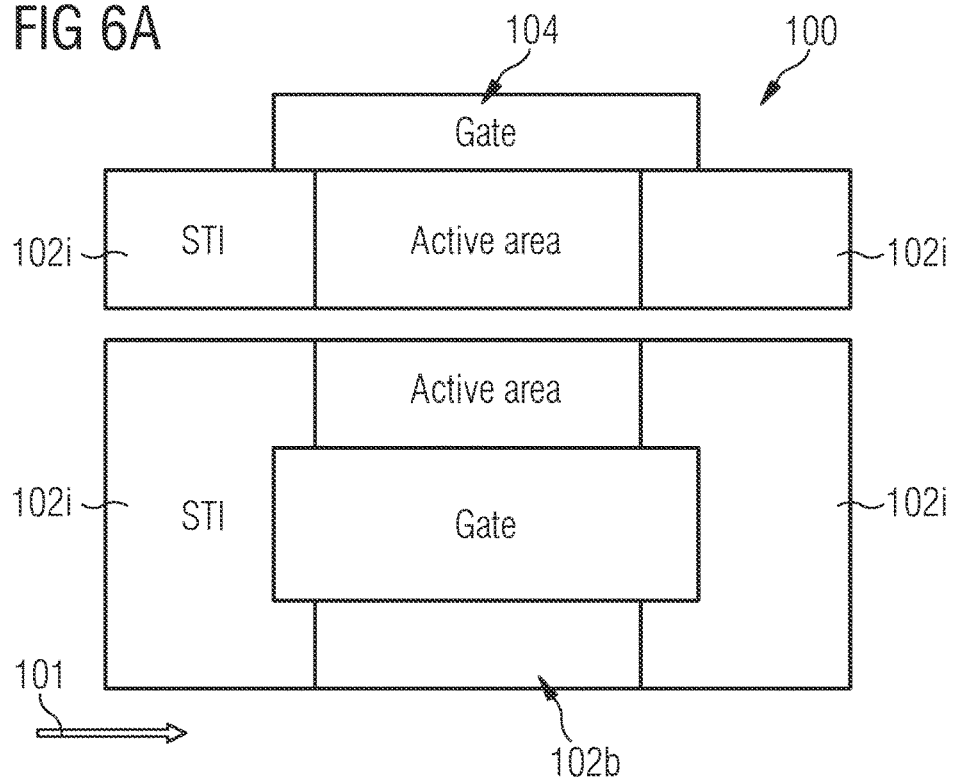
FIGS. 6A to 6D show respectively a semiconductor structure in a schematic cross sectional view during processing, according to various embodiments.

FIG. 6A illustrates a carrier 102 at an initial processing stage, according to various embodiments, the carrier 102 including an active area, e.g. a body region 102b, wherein the active area 102b may be laterally limited in the width direction 101 by two adjacent dielectric regions 102i. The gate 104 may extend between the dielectric regions 102i overlapping the body region 102b along the width direction 101. The gate 104 may include the gate region including for example polysilicon and the dielectric layer 104i separating the gate region from the body region 102b, as described before. According to various embodiments, the carrier 102 may be processed in commonly applied semiconductor technology, e.g. in CMOS technology, e.g. including layering, patterning (lithography, etching), ion implantation, doping, thermal treatment, cleaning, polishing, and the like. Further, the dielectric regions 102i may be provided via STI technology.

According to various embodiments, FIG. 6A shows a readily processed and implanted c-MOS transistor, e.g. in the classical gate-first flow, before the silicidation process is carried out.

Figure 6B:
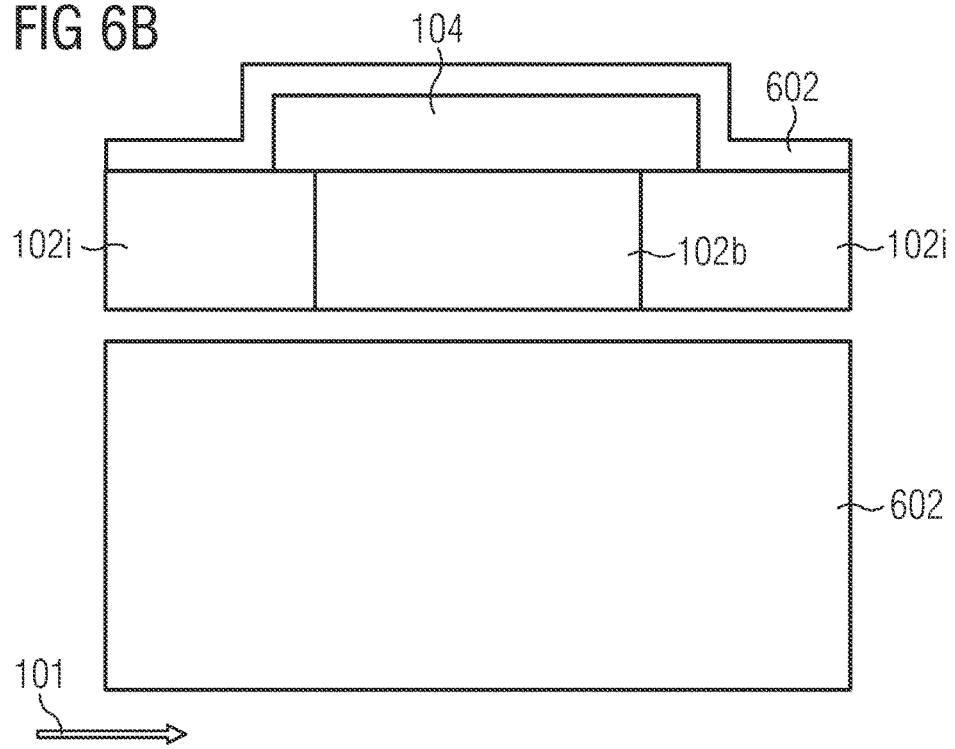

As illustrated in FIG. 6B, according to various embodiments, a blocking layer 602 may be formed over the carrier 102, the blocking layer 602 may for example cover the gate structure 104 completely. Further, the blocking layer 602 may cover the dielectric regions 102i, e.g. partially or completely. According to various embodiments, the blocking layer 602 may be formed via a chemical deposition process (CVD) or via a physical vapor deposition (PVD) process (via layering), e.g. via low pressure CVD, e.g. via atomic layer deposition (ALD), and the like. According to various embodiments, the blocking layer 602 may serve as a hard mask for the subsequent processing of the carrier 102m, the blocking layer 602 may include for example silicon nitride.

Figure 6C:
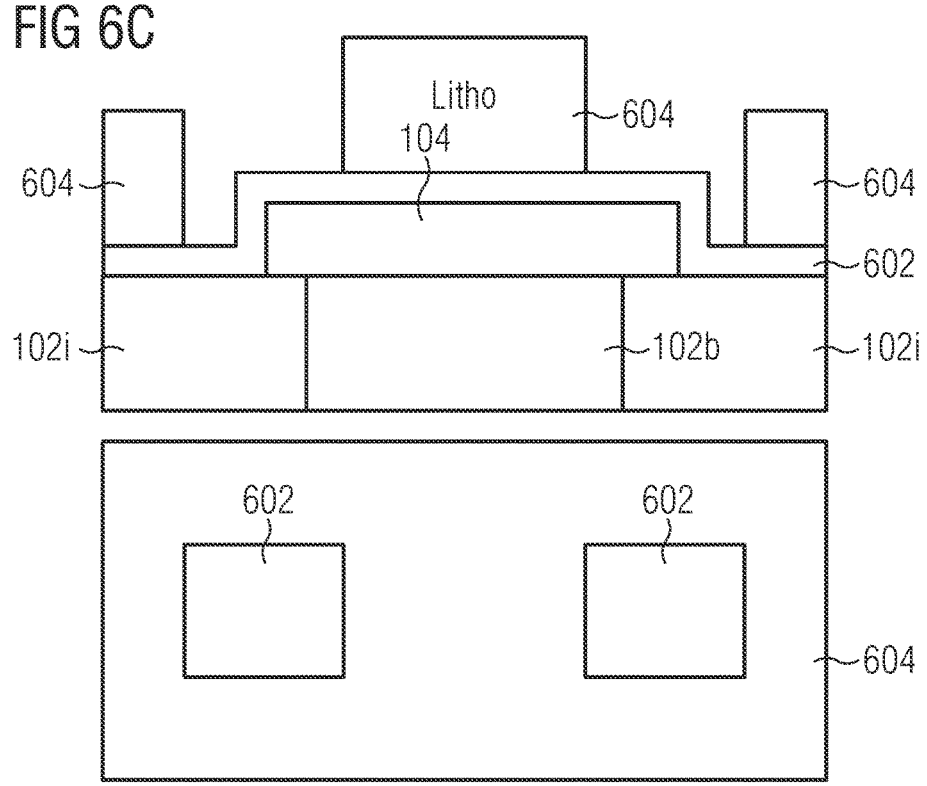

As illustrated in FIG. 6C, according to various embodiments, a patterned soft mask 604 may be formed over the carrier 102, e.g. partially covering the blocking layer 602. The patterned soft mask 604 may define the second regions 104b of the gate structure 104 to be modified. According to various embodiments, forming the patterned soft mask 604 may include applying any suitable resist and/or anti-reflective coating (ARC), e.g. via spin coating, and exposing the resist and developing the resist, as typically performed in lithographic processes. Due to the patterned soft mask 604 partially covering the blocking layer 602, the areas of the blocking layer 602 to be removed may be defined. In other words, the soft mask 604 may be applied to pattern the hard mask layer 602.

Figure 6D:
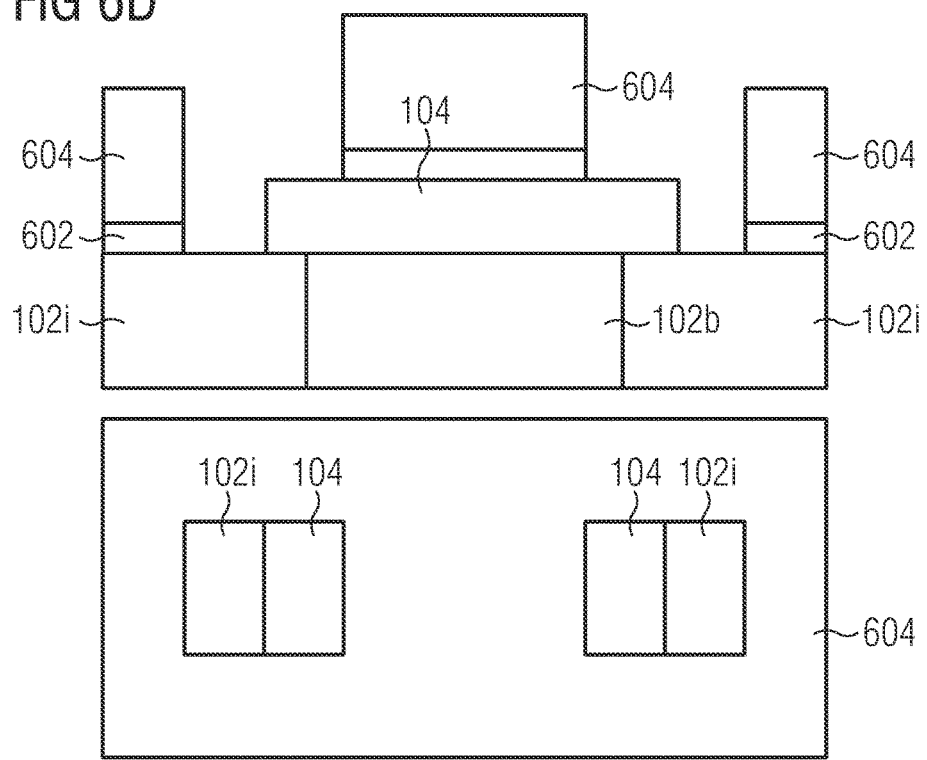

As illustrated in FIG. 6D, according to various embodiments, the exposed regions of the blocking layer 602 may be removed, e.g. the nitride hard mask may be patterned (or opened) for example via reactive ion etching (RIE). FIG. 6D illustrates the carrier 102 after the patterned hard mask layer 602 has been formed over the carrier 102 partially covering the gate structure 104 defining one or more second portions 104b of the gate structure 104 to be processed or modified.

Figure 7A:
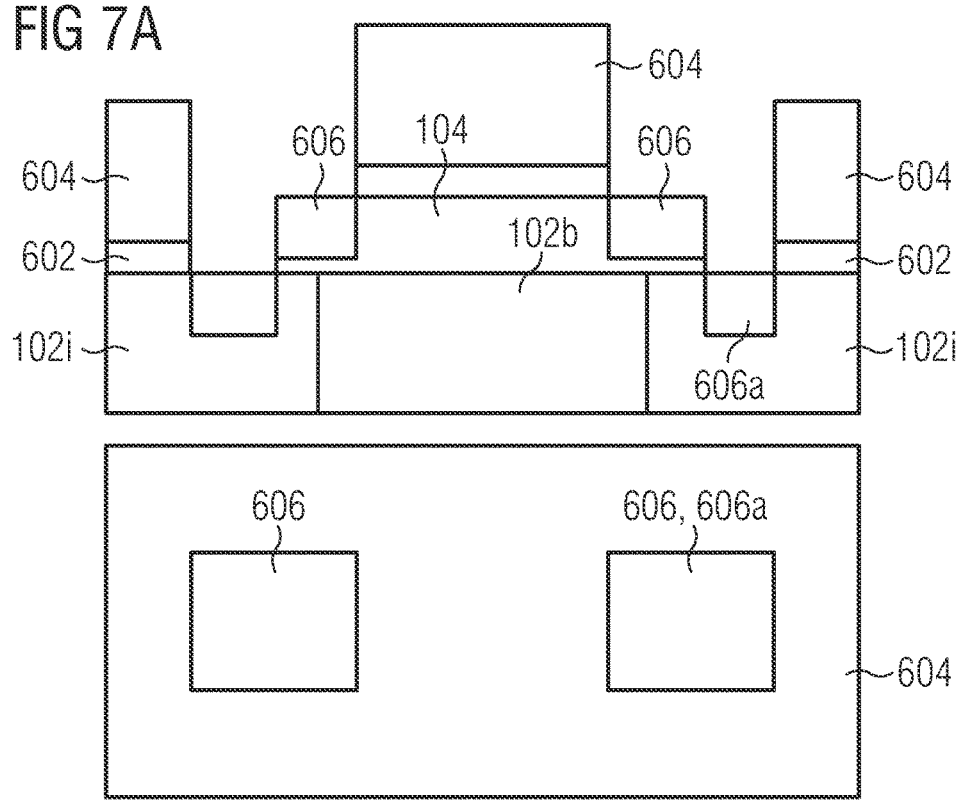
FIGS. 7A to 7F show respectively a semiconductor structure in a schematic cross sectional view during processing, according to various embodiments.

As illustrated in FIG. 7A, according to various embodiments, an ion implantation may be carried out for doping the exposed second portions 606 of the gate structure 104. The exposed second portions 606 of the gate structure 104 may be counter-doped such that the exposed second portions 606 of the gate structure 104 may be for example p-type doped if the rest 104a of the gate structure 104 is n-type doped or such that the exposed second portions 606 of the gate structure 104 may be for example n-type doped if the rest 104a of the gate structure 104 is p-type doped. The doping concentration in the exposed second portions 606 of the gate structure 104 may be for example in the range from about $10^{15}$ cm$^{-3}$ to about $10^{23}$ cm$^{-3}$. The doping concentration of the rest 104a of the gate structure 104 may be for example in the range from about $10^{15}$ cm$^{-3}$ to about $10^{23}$ cm$^{-3}$. According to various embodiments, the exposed regions 606a of the dielectric regions 102i may also be subjected to the ion implantation which may not affect the dielectric regions 102i. According to various embodiments, the counter-implantation of the second portions 606 of the gate 104 may shift the gate work function in these regions for providing a greater threshold voltage for the one or more edge regions 102e of the body region 102b. According to various embodiments, in the processed second portions 606 of the gate structure 104 the ability of the gate to invert the channel will be reduced and the corner areas (the edge regions 102e) of the device will contribute less to the drain current.

Figure 7B:
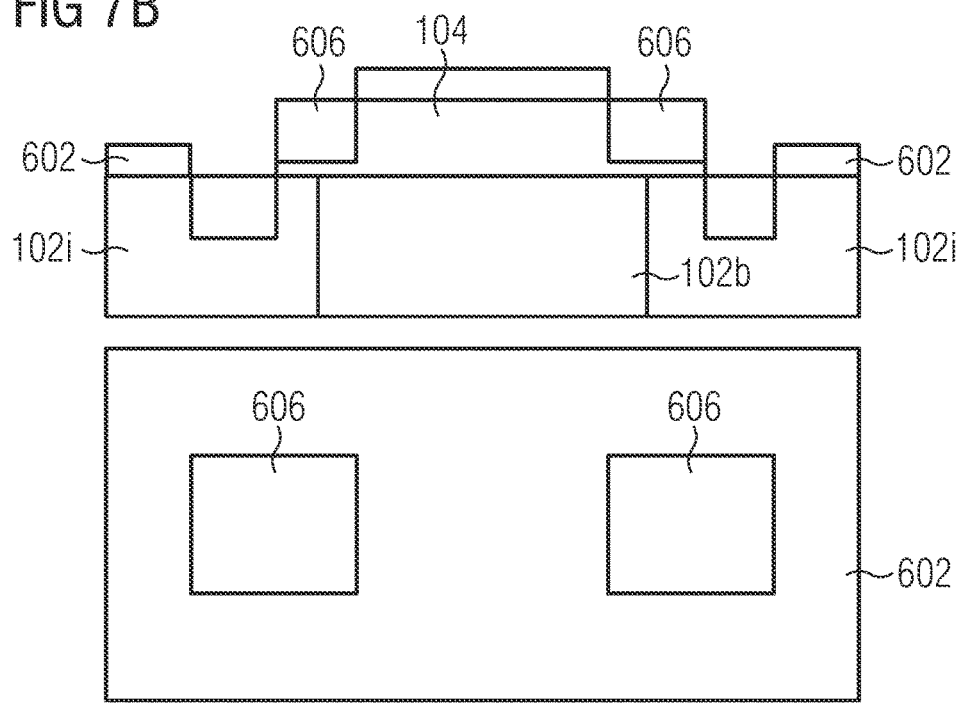

As illustrated in FIG. 7B, according to various embodiments, the patterned soft mask layer 604 may be removed, e.g. stripped. According to various embodiments, at this processing stage an anneal step may be carried out to activate the counter doping of the gate structure 104.

Figure 7C:
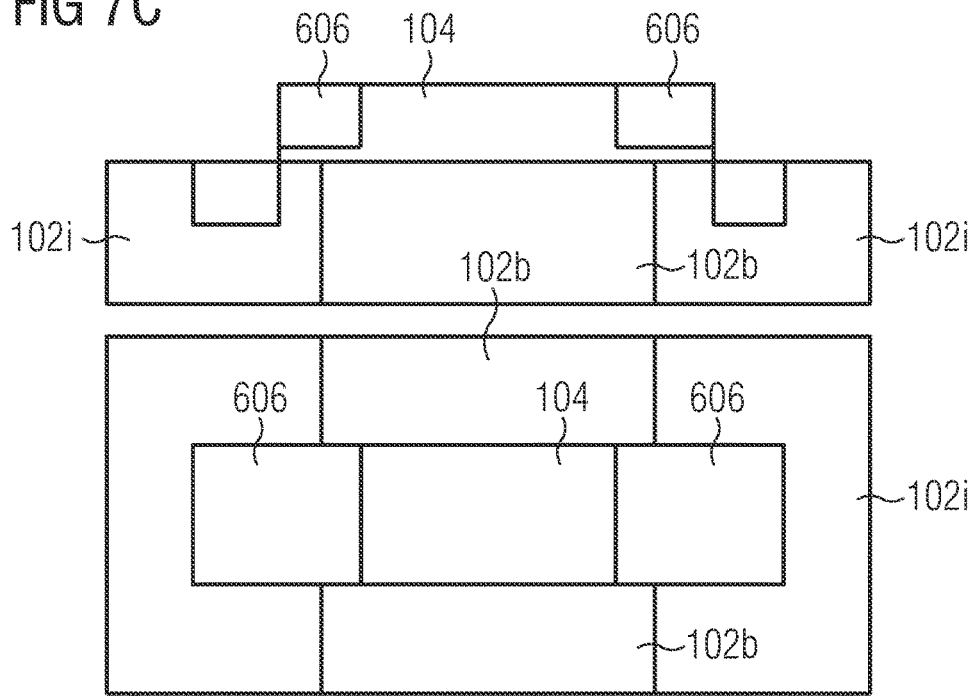

As illustrated in FIG. 7C, according to various embodiments, the patterned hard mask layer 602 may be removed, e.g. via etching. The etching may be selective to silicon nitride, e.g. by using phosphor acid as etchant. FIG. 7C shows a semiconductor structure 100, as for example described before.

Figure 7D:
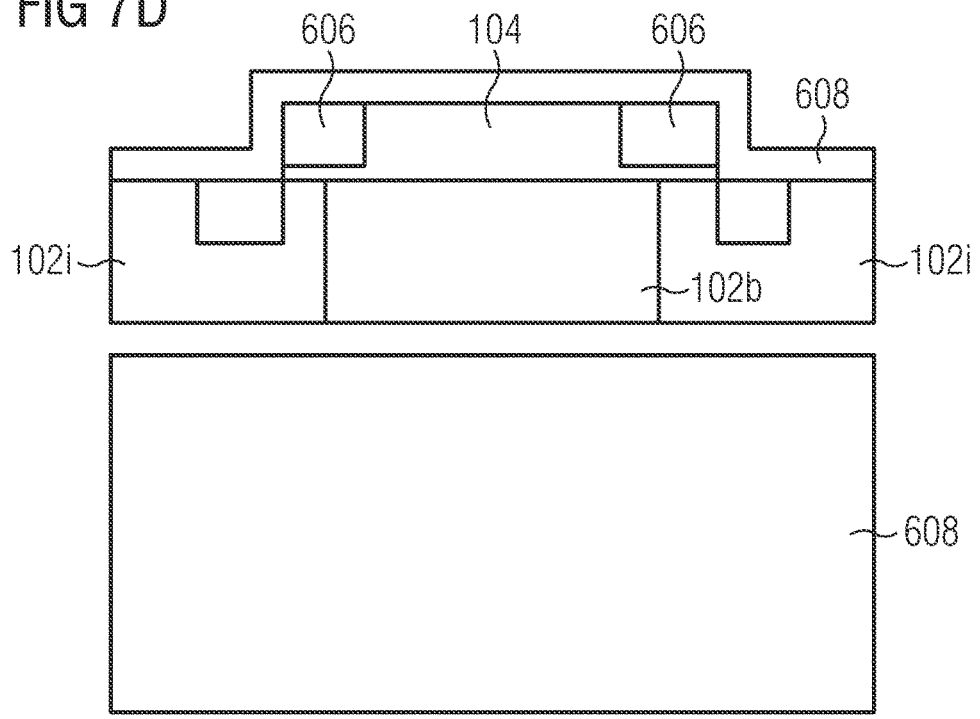

As illustrated in FIG. 7D, according to various embodiments, a metal layer 608 may be formed including a silicide forming metal, e.g. cobalt, nickel, titanium. The metal layer may be formed over the gate structure 104 for example via sputtering, after the gate structure 104 has been for example counter-doped.

Figure 7E:
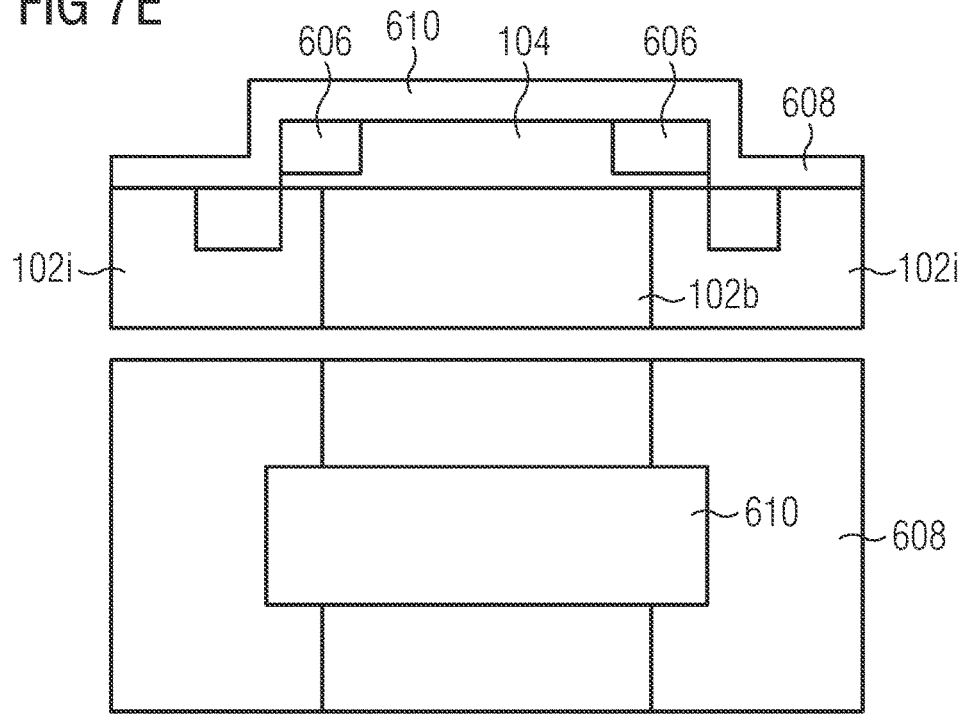

As illustrated in FIG. 7E, according to various embodiments, a silicidation (silicide formation) may be performed, by a thermal drive in. According to various embodiments, the silicided regions 610 may be formed in areas where the silicide forming metal is in physical contact with silicon. The silicidation may not occur in areas where the silicide forming metal is in physical contact with silicon oxide of the dielectric regions 102i such that unreacted metal will remain over the dielectric regions 102i after the silicidation.

Figure 7F:
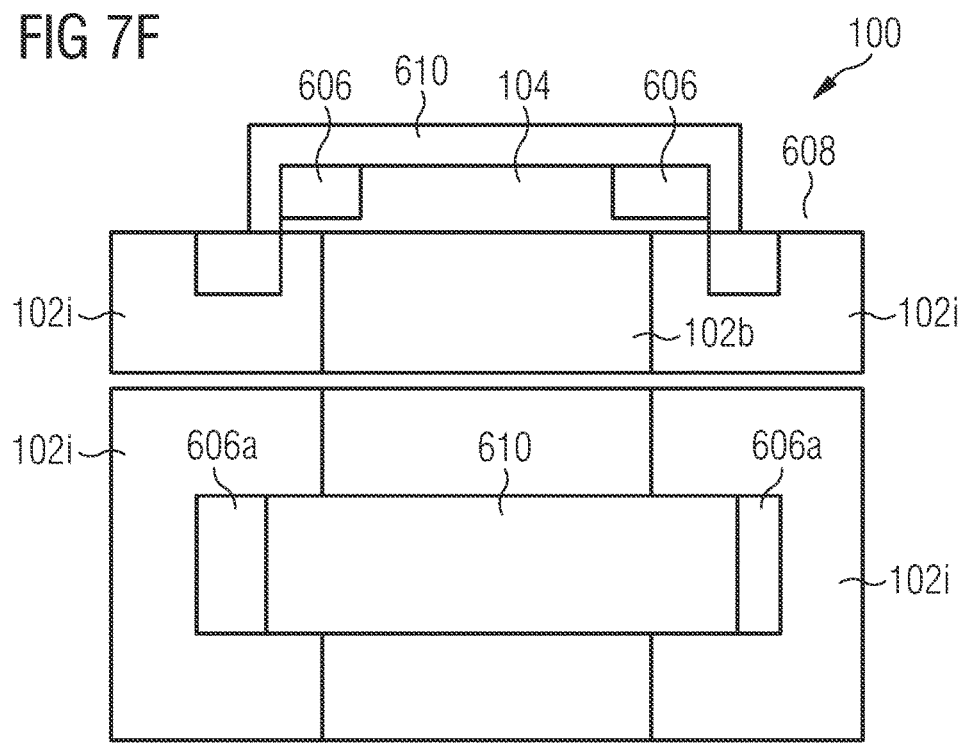

As illustrated in FIG. 7F, according to various embodiments, the unreacted metal may be stripped by any suitable chemical etching. According to various embodiments, the semiconductor structure 100, as schematically illustrated in FIG. 7F, may be a modified transistor (compared to the commonly used transistor design shown for example in FIG. 6A), wherein the one or more edge regions 102e of the modified transistor will barely contribute to the drain current in the DC mode due to the modified work function of the one or more second portions 606 of the gate structure 104.

According to various embodiments, the source/drain formation and/or the silicidation process may be self-aligned.

In the following, with reference to FIGS. 7A to 7F, a processing of the carrier 102 may be described similar to the processing described with reference to FIGS. 6A to 6F, wherein the gate structure 104 may be partially thinned, e.g. before the doping of the second portions 606 of the gate structure 104 is carried out or after the doping of the second portions 606 of the gate structure 104 has been carried out.

As illustrated in FIG. 8A, according to various embodiments, the gate structure 104 may include at least one, e.g. two, second portions 606 having a thickness less than the thickness of the remaining portion 104a (the first portion 104a) of the gate structure 104, wherein the second portions 606 of the gate structure 104 may be (for example optimally) counter doped, e.g. as described before with reference to FIG. 7B. The patterned hard mask layer 602 being used for thinning and/or doping the second portions 606 of the gate structure 104 may be optionally used to oxidize the surface of the second portions 606 or a part of the second portions 606 of the gate structure 104, e.g. via thermal oxidation. Therefore, according to various embodiments, an oxide layer 802 may cover the second portions 606 of the gate structure 104, as illustrated in FIG. 8B, according to various embodiments. Illustratively, the polysilicon of the gate structure may be partially oxidized to modify the one or more second portions 606 of the gate structure 104. According to various embodiments, the oxidation may be self-aligned.

As illustrated in FIG. 8C, according to various embodiments, the patterned hard mask layer 602 may be removed after the gate structure 104 has been partially modified, e.g. as described before via selective etching.

As illustrated in FIG. 8D, according to various embodiments, a metal layer 608 including a silicide forming metal may be formed, e.g. sputtered, over the gate structure 104 after the gate structure 104 has been for example counter-doped, thinned and/or oxidized.

Figure 8E:
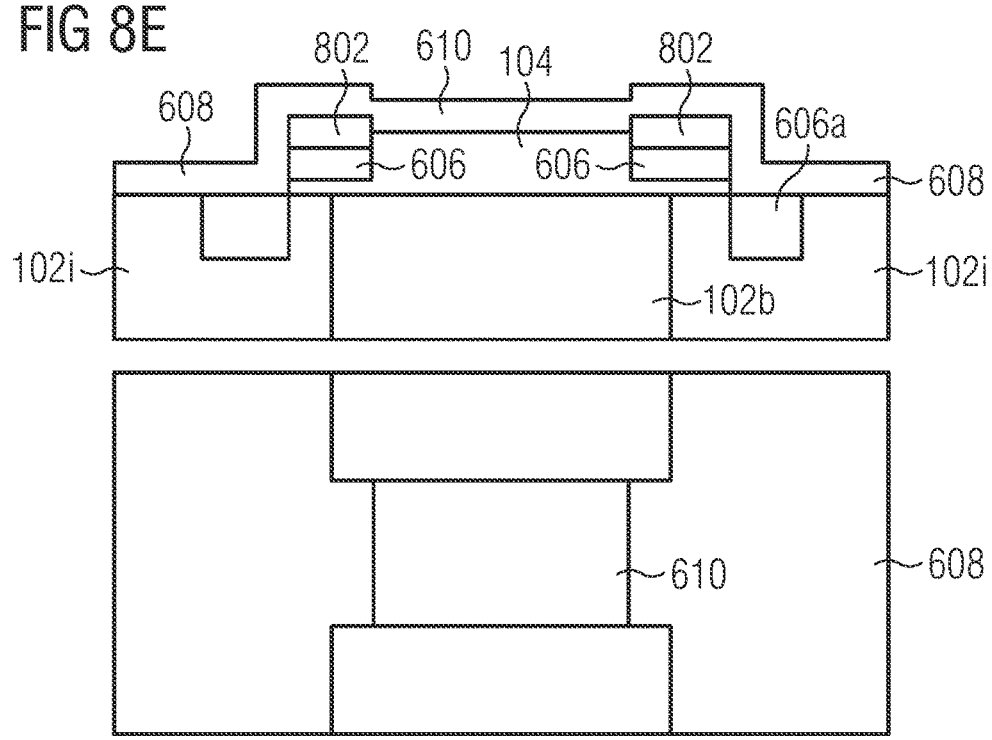

As illustrated in FIG. 8E, according to various embodiments, a silicidation (silicide formation) may be performed, by a thermal processing. According to various embodiments, the silicided region 610 may be formed where the silicide forming metal is in physical contact with silicon. The silicidation may not occur in areas where the silicide forming metal is in physical contact with silicon oxide of the dielectric regions 102i such that unreacted metal will remain over the dielectric regions 102i and over the second portions 606 of the gate structure 104 after the silicidation.

Figure 8F:
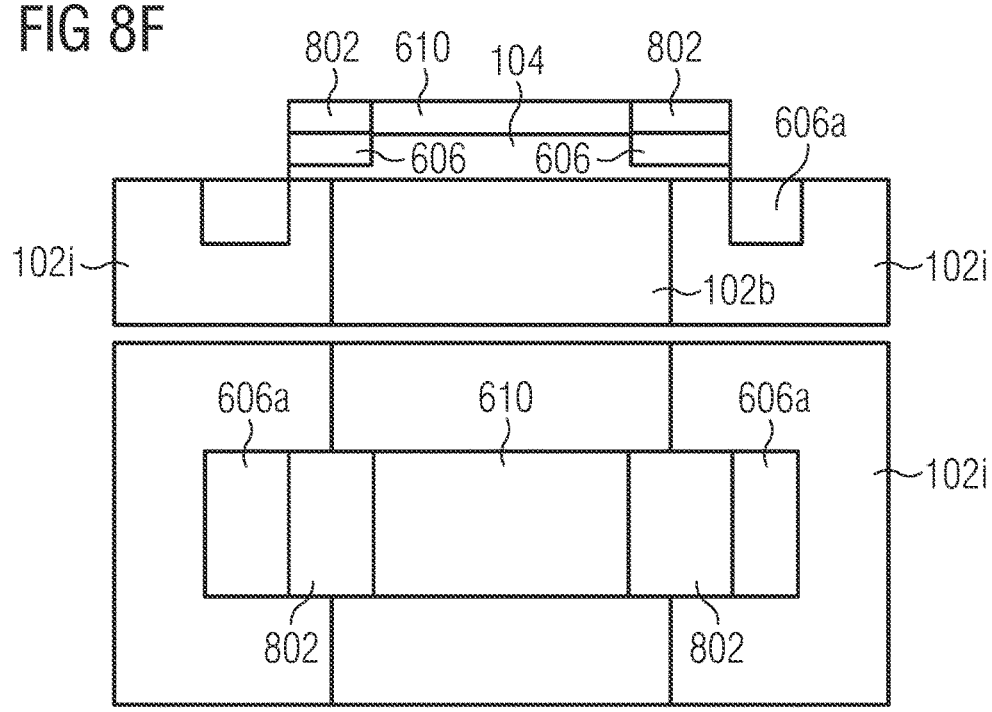

As illustrated in FIG. 8F, according to various embodiments, the unreacted metal may be stripped by any suitable chemical etching. According to various embodiments, the semiconductor structure 100, as schematically illustrated in FIG. 8F, may be a modified transistor (compared to the commonly used transistor design shown for example in FIG. 6A), wherein the edge regions 102e of the body region 102b of the modified transistor will barely contribute to the drain current in the DC mode and/or AC mode due to modified work function (counter doping) of the one or more second portions 606 of the gate structure 104 and the thinning of the one or more second portions 606 of the gate structure 104 and the blocking of silicide formation over the one or more second portions 606 of the gate structure 104. According to various embodiments, if the transistor 100 may be designed for AC mode only, merely the blocking of the silicide formation over the one or more second portions 606 of the gate structure 104 may be required, wherein the counter doping and/or the thinning may be optional. According to various embodiments, if the transistor 100 may be designed for DC mode only, merely the counter doping of the one or more second portions 606 of the gate structure 104 may be required, wherein a thinning and/or a blocking of the silicide formation over the one or more second portions 606 of the gate structure 104 may be optional.

According to various embodiments, the work function of the one or more second portions of the transistor gate 104 overlapping the one or more corner device regions (the edge regions 102e) of the semiconductor structure 100 may be modified thus reducing the parasitic currents through the corner device, e.g. in overdrive and/or in the sub-threshold operation modes. Further, according to various embodiments, the transistor gate 104 may be modified such that the corner trans-conductance at high frequencies may be strongly lowered by a local increase of the gate conductance.

According to various embodiments, a local work function shift in the transistor gate 104 may be obtained by masked implant of the gate/STI edge overlap regions 104b, 606, e.g. a high dose p-type instead high dose n-type as usual for a n-MOS transistor or e.g. a high dose n-type instead high dose p-type as usual for a p-MOS transistor. According to various embodiments, a conductance change of the corner device gate regions 104b, 606 may be obtained by masked blocking of the gate silicidation and can be optionally enhanced by masked thinning of the gate polysilicon 104b, 606.

Further, according to various embodiments, local implants into the edges of the active area may reduce the influence of the corner devices by shifting the onset of corner conduction to higher gate-source voltages.

According to various embodiments, a doping profile may be detected via Scanning Spreading Resistance Microscopy (SSRM) or a similar method to resolve lateral doping profiles.

According to various embodiments, the gate structure 104 may include in the second portions 104b, 606 a low n-type doping, a low p-type doping, or no doping, e.g. with a doping concentration in the range from about zero to about $10^{15}$ cm$^{-3}$ which may save the silicide blocking scheme. The gate work function effect may be reduced in this case to about 0.5V. According to various embodiments, the gate depletion let rise effective gate oxide thickness and will increase the serial resistance. According to various embodiments, the patterned hard mask layer, as for example illustrated in FIG. 8A may be used for an impurity implantation (e.g. carbon) to stop out diffusion from gate doping.

According to various embodiments, a semiconductor structure may include: a first source/drain region and a second source/drain region; a body region disposed between the first source/drain region and the second source/drain region, the body region including a core region and at least one edge region at least partially surrounding the core region; a dielectric region next to the body region and configured to limit a current flow through the body region in a width direction of the body region, wherein the at least one edge region is arranged between the core region and the dielectric region; and a gate structure configured to control the body region; wherein the gate structure is configured to provide a first threshold voltage for the core region of the body region and a second threshold voltage for the at least one edge region of the body region, wherein the first threshold voltage is less than or equal to the second threshold voltage.

According to various embodiments, the gate structure may include a gate region and a dielectric layer disposed between the gate region and the body region.

According to various embodiments, the gate region may include a first portion at least overlapping the core region of the body region and at least one second portion next to the first portion at least overlapping the at least one edge region of the body region.

According to various embodiments, the gate region may include a semiconductor material.

According to various embodiments, the gate region may be doped via one or more dopants, wherein the first portion of the gate region may differ from the at least one second portion of the gate region in at least one of doping type or doping concentration.

According to various embodiments, the first portion of the gate region may have a first thickness and the at least one second portion of the gate region may have a second thickness, wherein the first thickness may be greater than the second thickness.

According to various embodiments, the semiconductor structure may further include: an electrically conductive layer at least partially covering the gate region and electrically contacting the gate region at least partially.

According to various embodiments, the semiconductor structure may further include: one or more metallization layers.

According to various embodiments, the first portion of the gate region may be covered by the electrically conductive layer and the at least one second portion of the gate region may be free from the electrically conductive layer.

According to various embodiments, the first portion of the gate region may include silicon and the electrically conductive layer may include a metal silicide electrically contacting the first portion of the gate region.

According to various embodiments, the at least one second portion of the gate region may be covered by an oxide layer in physical contact with the at least one second portion of the gate region.

According to various embodiments, the dielectric region may include a trench structure at least partially filled with a dielectric material.

According to various embodiments, the gate region may extend along the width direction of the body region partially overlapping the body region, wherein the extension of the gate region along the width direction may be less than the extension of the body region along the width direction.

According to various embodiments, the gate region may extend along the width direction of the body region overlapping the body region and partially overlapping the dielectric region, wherein the extension of the gate region along the width direction may be greater than the extension of the body region along the width direction.

According to various embodiments, the extension of the body region along the width direction may be less than about 50 µm. According to various embodiments, the extension of the body region along the width direction may be less than about 10 µm.

According to various embodiments, the extension of the at least one edge region along the width direction may be greater than 1% of the extension of the body region along the width direction.

According to various embodiments, the dielectric layer disposed between the gate region and the body region may include a first portion with a first thickness overlapping the core region of the body region and at least one second portion next to the first portion of the dielectric layer with a second thickness overlapping the at least one edge region of the body region, wherein the first thickness is less than the second thickness. According to various embodiments, the second portion of the gate region may partially overlap the adjacent dielectric region 102i. According to various embodiments, the gate oxide between the edge region 102e of the body region 102b and the electrically conductive gate region (e.g. the polysilicon region of the gate structure 104) may be thicker than the gate oxide between the core region 102c of the body region 102b and the electrically conductive gate region (e.g. the polysilicon region of the gate structure 104).

According to various embodiments, a method for manufacturing a semiconductor structure may include: forming a first source/drain region, a second source/drain region, and a body region disposed between the first source/drain region and the second source/drain region, the body region including a core region and at least one edge region at least partially surrounding the core region; forming a dielectric region next to the body region and configured to limit a current flow through the body region in a width direction of the body region, wherein the edge region is arranged between the core region and the dielectric region; and forming a gate structure configured to control the body region; wherein the gate structure is configured to provide a first threshold voltage for the core region of the body region and a second threshold voltage for the edge region of the body region, wherein the first threshold voltage is less than or equal to the second threshold voltage.

According to various embodiments, a method for processing a carrier may include: forming a transistor structure at least one of over an in the carrier, the transistor structure including: a first source/drain region and a second source/drain region; a body region disposed between the first source/drain region and the second source/drain region, the body region including a core region and an edge region at least partially surrounding the core region; a dielectric region next to the body region and configured to limit a current flow through the body region in a width direction of the body region, wherein the edge region is arranged between the core region and the dielectric region; and a gate structure configured to control the body region; processing at least one of a first portion of the gate structure or a second portion of the gate structure such that a first threshold voltage is provided for the core region of the body region and such that a second threshold voltage is provided for the edge region of the body region, wherein the first threshold voltage is equal to or less than the second threshold voltage.

According to various embodiments, the gate structure may include a gate region and a dielectric layer disposed between the gate region and the body region, the gate region including semiconductor material; wherein processing at least one of the first portion of the gate structure or the second portion of the gate structure may include: doping at least one of the first portion of the gate structure or the second portion of the gate structure such that the first portion of the gate structure differs from the at least one second portion of the gate structure in at least one of doping type or doping concentration.

According to various embodiments, processing at least one of the first portion of the gate structure or the second portion of the gate structure may include: forming an electrically conductive layer contacting the first portion of the gate structure, wherein the second portion of the gate structure is free from the electrically conductive layer and electrically conductively connected to the electrically conductive layer via the first portion of the gate structure.

According to various embodiments, a transistor structure may include: a body region connecting at least two source/drain regions, the body region including a core region and at least one edge region partially surrounding the core region; a dielectric region next to the at least one edge region of the body region; a gate for controlling the body region, the gate including a first portion and at least one second portion respectively including semiconductor material, the first portion at least extending over the core region and the at least one second portion at least extending over the at least one edge region, wherein the first portion of the gate differs from the at least one second portion of the gate in at least one of doping type or doping concentration.

According to various embodiments, a dielectric layer may be disposed at least between the gate and the body region to electrically isolate the gate from the body region, According to various embodiments, the first portion of the gate substantially controls the core region of the body region and wherein the at least one second portion of the gate substantially controls the at least one edge region of the body region.

According to various embodiments, a transistor structure may include: a body region connecting at least two source/drain regions, the body region including a core region and at least one edge region partially surrounding the core region; a dielectric region next to the at least one edge region of the body region; a gate for controlling the body region, the gate including a first portion and at least one second portion respectively including semiconductor material, the first portion at least extending over the core region and the at least one second portion at least extending over the at least one edge region, a gate contact layer (silicide) disposed over the first portion electrically contacting the first portion of the gate directly, wherein the at least one second portion of the gate is free from the gate contact layer such that the at least one second portion of the gate is indirectly electrically contacted via the first region.

According to various embodiments, the first portion may have a first thickness and at least one second portion has a second thickness, wherein the first thickness is greater than the second thickness.

According to various embodiments, a method for processing a carrier may include: providing at least two source/drain regions and a body region connecting the at least two source/drain regions in an active region of the carrier, forming a gate region over the body region, the gate region including a semiconductor material doped with a first type of dopants, partially counter-doping the gate region with a second type of dopants.

According to various embodiments, a method for processing a carrier may include: providing at least two source/drain regions and a body region connecting the at least two source/drain regions in an active region of the carrier, forming a dielectric layer over the body region, forming a gate structure over the dielectric layer, partially thinning the gate such that a first gate region has a first thickness and such that at least a second gate region has a second thickness different from the first thickness.

According to various embodiments, a method for processing a carrier may include: providing at least two source/drain regions and a body region connecting the at least two source/drain regions in an active region of the carrier, forming a dielectric layer over the body region, forming a gate structure over the dielectric layer, the gate region including a semiconductor material, partially covering a surface of the gate region with a metal layer; performing an anneal to form a metal compound from the metal and the semiconductor material of the gate region, the metal compound partially covering the surface of the gate region.

According to various embodiments, a method for processing a carrier may include: providing at least two source/drain regions and a body region connecting the at least two source/drain regions in an active region of the carrier, forming a dielectric structure partially surrounding the body region, the dielectric structure defining an edge region of the body region at least partially surrounding a core region of the body region; forming a dielectric layer over edge region and the core region the body region, forming a gate for controlling the body region, the gate including a first gate region in contact with the dielectric layer overlapping the core region of the body region and at least one second gate region in contact with the dielectric layer overlapping the edge region; processing at least one of the first gate region or the second gate region such that a first threshold voltage of the core region of the body region is less than a second threshold voltage of the edge region of the body region.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a carrier comprising:
providing at least two source/drain regions and a body region connecting the at least two source/drain regions in an active region of the carrier;
forming a dielectric region next to the body region and configured to limit a current flow through the body region in a width direction of the body region, wherein an edge region is arranged between the body region and the dielectric region; and
forming a dielectric layer over the body region;
forming a gate structure over the dielectric layer, the gate structure comprising a gate region including a semiconductor material;
partially covering a surface of the gate region with a metal layer; and
performing an anneal to form a metal compound from the metal layer and the semiconductor material of the gate region, the metal compound partially covering the surface of the gate region.

2. The method of claim 1,
wherein the gate structure is configured to provide a first threshold voltage for the core region of the body region and a second threshold voltage for the at least one edge region of the body region, wherein the first threshold voltage is less than or equal to the second threshold voltage.

3. The method of claim 1,
wherein the dielectric layer is disposed between the gate region and the body region.

4. The method of claim 3,
wherein the gate region comprises a first portion at least overlapping the body region and at least one second portion next to the first portion at least overlapping the at least one edge region of the body region.

5. The method of claim 4, further comprising:
doping the gate region with one or more dopants;
wherein the first portion of the gate region differs from the at least one second portion of the gate region in at least one of doping type or doping concentration.

6. The method of claim 5, further comprising:
partially thinning the gate such that a first gate region has a first thickness and such that at least a second gate region has a second thickness different from the first thickness, and wherein the first thickness is greater than the second thickness.

7. The method of claim 4,
wherein the metal compound at least partially covers the gate region and at least partially electrically contacts the gate region.

8. The method of claim 7,
wherein the first portion of the gate region is covered by the metal compound and wherein the at least one second portion of the gate region is free from the metal compound.

9. The method of claim 8,
wherein the at least one second portion of the gate region is covered by an oxide layer in physical contact with the at least one second portion of the gate region.

10. The method of claim 1,
wherein the dielectric region comprises a trench structure at least partially filled with a dielectric material.

11. The method of claim 2,
wherein the gate region extends along the width direction of the body region partially overlapping the body region, wherein the extension of the gate region along the width direction is less than the extension of the body region along the width direction.

12. The method of claim 2,
wherein the gate region extends along the width direction of the body region overlapping the body region and partially overlapping the dielectric region, wherein the extension of the gate region along the width direction is greater than the extension of the body region along the width direction.

13. The method of claim 2,
wherein the dielectric layer disposed between the gate region and the body region comprises a first portion with a first thickness overlapping the core region of the body region and at least one second portion next to the first portion of the dielectric layer with a second thickness overlapping the at least one edge region of the body region, wherein the first thickness is less than the second thickness.

14. A transistor structure comprising:
a body region connecting at least a first source/drain region and a second source/drain region, the body region comprising a core region and an edge region at least partially surrounding the core region;
a dielectric region located next to the body region and configured to limit a current flow through the body region in a width direction of the body region, wherein the edge region is arranged between the core region and the dielectric region; and
a gate configured to control the body region; the gate including a first portion and at least one second portion respectively including semiconductor material, the first portion at least extending over the core region and the at least one second portion at least extending over the at least one edge region;

a gate contact layer disposed over and directly electrically contacting the first portion of the gate, wherein the at least one second portion of the gate is free from the gate contact layer so that the least one second portion of the gate is indirectly electrically contacted via the first portion to the gate contact layer.

15. The transistor structure of claim 14, wherein a first threshold voltage for the core region is equal to or less than a second threshold voltage for the edge region.

16. The transistor structure of claim 14,
   wherein the gate structure comprises a gate region and a dielectric layer disposed between the gate region and the body region, the gate region comprising a semiconductor material; and
   wherein at least one of the first portion of the gate structure differs from at least one second of the gate structure in at least one of doping type of concentration.

17. The transistor structure of claim 14, wherein the gate contact layer comprises silicide.

18. The transistor structure of claim 14, further comprising
   an electrically conductive layer contacting the first portion of the gate structure, wherein the second portion of the gate structure is free from the electrically conductive layer and electrically conductively connected to the electrically conductive layer via the first portion of the gate structure.

* * * * *